(12) United States Patent
Yang et al.

(10) Patent No.: US 8,993,998 B2
(45) Date of Patent: Mar. 31, 2015

(54) ELECTRO-OPTIC DEVICE HAVING NANOWIRES INTERCONNECTED INTO A NETWORK OF NANOWIRES

(71) Applicant: The Regents of the University of California, Oakland, CA (US)

(72) Inventors: Yang Yang, Los Angeles, CA (US); Rui Zhu, Los Angeles, CA (US); Chun Chao Chen, Temple City, CA (US); Letian Dou, Los Angeles, CA (US); Gang Li, Arcadia, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 13/841,367

(22) Filed: Mar. 15, 2013

(65) Prior Publication Data

US 2014/0084266 A1  Mar. 27, 2014

Related U.S. Application Data

(60) Provisional application No. 61/667,330, filed on Jul. 2, 2012.

(51) Int. Cl.
*H01L 29/06* (2006.01)
*H01L 31/0328* (2006.01)
(Continued)

(52) U.S. Cl.
CPC .......... *H01L 51/442* (2013.01); *H01L 51/5203* (2013.01); *H01L 51/56* (2013.01); *Y02E 10/549* (2013.01); *H01L 51/4253* (2013.01); *H01L 51/0036* (2013.01); *H01L 51/0037* (2013.01); *H01L 51/0043* (2013.01); *H01L 51/0046* (2013.01); *H01L 51/0047* (2013.01); *H01L 51/0064* (2013.01); *H01L 51/0078* (2013.01);
(Continued)

(58) Field of Classification Search
USPC .................. 257/13, 94, 95, E29.07, E33.074; 977/932, 825
See application file for complete search history.

(56) References Cited

U.S. PATENT DOCUMENTS 7,566,945 B2 *  7/2009  Choi et al. .................... 257/522
7,728,333 B2 *  6/2010  Kastalsky ....................... 257/72
(Continued)

FOREIGN PATENT DOCUMENTS

KR     20100096642 A    9/2010
KR     20120033555 A    4/2012

OTHER PUBLICATIONS

Ameri et al., *Adv. Funct. Mater*. 20, 1592 (Apr. 2010).
Bailey-Salzman, B. P. Rand, S. R. Forrest, *Appl. Phys. Lett.* 88, 233502 (2006).
Bauer, T. Wahl, J. Hanisch, E. Ahlswede, *Appl. Phys. Lett.* 100, 073307 (Feb. 2012).
(Continued)

*Primary Examiner* — Ida M Soward
(74) *Attorney, Agent, or Firm* — Venable LLP; Henry J. Daley

(57) ABSTRACT

An electro-optic device includes a first electrode, an active layer formed over and electrically connected with the first electrode, a buffer layer formed over and electrically connected with the active layer, and a second electrode formed directly on the buffer layer. The second electrode includes a plurality of nanowires interconnected into a network of nanowires. The buffer layer provides a physical barrier between the active layer and the plurality of nanowires to prevent damage to the active layer while the second electrode is formed.

28 Claims, 14 Drawing Sheets

(51) Int. Cl.

| | | |
|---|---|---|
| *H01L 31/0336* | (2006.01) | |
| *H01L 31/072* | (2012.01) | |
| *H01L 31/109* | (2006.01) | |
| *H01L 29/22* | (2006.01) | |
| *H01L 33/00* | (2010.01) | |
| *H01L 51/44* | (2006.01) | |
| *H01L 51/52* | (2006.01) | |
| *H01L 51/56* | (2006.01) | |
| *H01L 51/42* | (2006.01) | |
| *H01L 51/00* | (2006.01) | |

(52) U.S. Cl.
CPC ......... *H01L 51/0094* (2013.01); *H01L 51/4226* (2013.01); *H01L 51/5206* (2013.01); *H01L 51/5234* (2013.01); *H01L 2251/308* (2013.01); *Y10S 977/825* (2013.01); *Y10S 977/932* (2013.01)
USPC ............ 257/13; 257/94; 257/95; 257/E29.07; 257/E33.074; 977/825; 977/932

(56) References Cited

U.S. PATENT DOCUMENTS

| | | | | |
|---|---|---|---|---|
| 7,737,429 | B2 * | 6/2010 | Kim et al. | 257/11 |
| 7,781,778 | B2 * | 8/2010 | Moon et al. | 257/79 |
| 7,867,814 | B2 * | 1/2011 | Nihei et al. | 438/102 |
| 7,906,354 | B1 * | 3/2011 | Ellinger et al. | 438/26 |
| 7,932,189 | B2 * | 4/2011 | Merchant et al. | 438/787 |
| 8,008,672 | B2 * | 8/2011 | Moon et al. | 257/79 |
| 8,441,019 | B2 * | 5/2013 | Hwang | 257/81 |
| 8,476,088 | B2 * | 7/2013 | Lee et al. | 438/22 |
| 8,525,215 | B2 * | 9/2013 | Choi et al. | 257/99 |
| 8,637,859 | B2 * | 1/2014 | Pschenitzka | 257/40 |
| 8,669,582 | B2 * | 3/2014 | Na et al. | 257/99 |
| 2009/0173976 | A1 * | 7/2009 | Augusto | 257/292 |
| 2010/0047522 | A1 | 2/2010 | Sivarajan et al. | |
| 2010/0078074 | A1 | 4/2010 | Yang et al. | |
| 2010/0096004 | A1 * | 4/2010 | Hu et al. | 136/256 |
| 2012/0298954 | A1 * | 11/2012 | Kim et al. | 257/13 |
| 2012/0319976 | A1 * | 12/2012 | Ahn et al. | 345/173 |
| 2013/0092900 | A1 * | 4/2013 | Lowgren et al. | 257/13 |

OTHER PUBLICATIONS

Becerril et al., *ACS Nano* 2, 463 (2008).
Brabec et al., *Adv. Mater.* 22, 3839 (Aug. 2010).
Colsmann et al., *Adv. Energy Mater.* 1, 599 (May 2011).
De et al., *ACS Nano* 3, 1767 (2009).
Dou et al., *Nat. Photonics* 6, 180 (Feb. 2012).
Gaynor, J. Y. Lee, P. Peumans, *ACS Nano* 4, 30 (Dec. 2009).
Hecht, L. B. Hu, G. Irvin, *Adv. Mater.* 23, 1482 (Feb. 2011).
Henemann, *Renewable Energy Focus* 9, 14 (2008).
Hu, H. S. Kim, J. Y. Lee, P. Peumans, Y. Cui, *ACS Nano* 4, 2955 (Apr. 2010).
Huang, G. Li, Y. Yang, *Adv. Mater.* 20, 415 (2008).
Kim et al., *Adv. Mater.* 18, 572 (2006).
Lee et al., *ACS Nano* 5, 6564 (Jul. 2011).
Lee, S. T. Connor, Y. Cui, P. Peumans, *Nano. Lett.* 8, 689 (2008).
Li, R. Zhu, Y. Yang, *Nat. Photonics* 6, 153 (Feb. 2012).
Lipomi, B. C. K. Tee, M. Vosgueritchian, Z. N. Bao, *Adv. Mater.* 23, 1771 (Feb. 2011).
Lunt, V. Bulovic, *Appl. Phys. Lett.* 98, 113305 (Mar. 2011).
Meiss, F. Holzmueller, R. Gresser, K. Leo, M. Riede, *Appl. Phys. Lett.* 99, 193307 (Nov. 2011).
Ng et al., *Appl. Phys. Lett.* 90, 103505 (2007).
Park, J. H. Li, A. Kumar, G. Li, Y. Yang, *Adv. Funct. Mater.* 19, 1241 (2009).
Park, T. Xu, J. Y. Lee, A. Ledbetter, L. J. Guo, *ACS Nano* 5, 7055 (Jul. 2011).
Pasquier, H. E. Unalan, A. Kanwal, S. Miller, M. Chhowalla, *Appl. Phys. Lett.* 87, 203511 (2005).
Rowell et al., *Appl. Phys. Lett.* 88, 233506 (2006).
Shockley, H. J. Queisser, *J. Appl. Phys.* 32, 510 (1961).
Tung et al., *Nano. Lett.* 9, 1949 (2009).
Xu et al., *Adv. Funct. Mater.* 19, 1227 (2009).
Yu et al., *Adv. Mater.* 23, 664 (Dec. 2010).
Yu, J. Gao, J. C. Hummelen, F. Wudl, A. J. Heeger, *Science* 270, 1789 (1995).
Zhu et al., *ACS Nano* 5, 9877 (Oct. 2011).
Zhu, A. Kumar, Y. Yang, *Adv. Mater.* 23, 4193 (Aug. 2011).
International Search Report and Written Opinion issued in PCT/US2013/032460 dated Mar. 15, 2013.

* cited by examiner

ELECTRO-OPTIC DEVICE HAVING NANOWIRES INTERCONNECTED INTO A NETWORK OF NANOWIRES

CROSS-REFERENCE TO RELATED APPLICATION

This application claims priority to U.S. Provisional Application No. 61/667,330 filed Jul. 2, 2012, the entire contents of which are hereby incorporated by reference.

This invention was made with Government support under Grant No. N00014-11-1-0250, awarded by the U.S. Navy, Office of Naval Research. The Government has certain rights in this invention.

BACKGROUND

1. Field of Invention

The field of the currently claimed embodiments of this invention relates to—electro-optic devices and methods of production, and more particularly to organic electro-optic devices.

2. Discussion of Related Art

Solar cell technology has been expected to be the most effective method for producing clean energy at low cost and minimum pollution. Beginning from the last century, solar cell technologies have evolved based on various material systems used for harvesting the solar energy. The most traditional, yet the most commonly available kind of solar cell technology is based on the utilization of crystalline silicon as the active absorbing material. However, due to the high cost of purifying silicon into high crystalline state, the application of silicon-based solar cells as a major energy source is limited.

In recent years, conductive and semi-conductive conjugated polymers have attracted much attention for their applications in organic photovoltaics (OPVs) and organic light emitting diodes (OLED). Organic photovoltaics have drawn intense attention due to their advantages over competing solar cell technologies. Current progress in the power-conversion efficiency (PCE) of OPVs has overcome the 10% PCE barrier, suggesting a promising future for OPVs as a low-cost and highly efficient photovoltaic (PV) candidate for solar energy harvesting. In addition to the pursuit of high device efficiency, OPVs are also intensely investigated for their potential in making advances in much broader applications. One of these applications is to achieve high-performance visually transparent or semi-transparent PV devices, which could open up PV applications in many untapped areas such as building-integrated photovoltaics (BIPV). The advantages of OPVs, such as low cost, ease of processing, flexibility, lightweight and highly transparent, make polymer solar cells (PSCs) a good candidate for BIPV purpose.

Previously, many attempts have been made to demonstrate visually transparent or semi-transparent OPV cells (TOPV or s-TOPV). We define TOPVs as organic solar cells that have an average transparency within the visible light region (400 nm~650 nm) ($T_{ave\text{-}vis}$) of ≥50% and s-TOPVs as organic solar cells that have $T_{ave\text{-}vis}$ between 0% and 50%. Transparent conductors, such as thin metal films, metallic grids, metal nanowire networks, metal oxide, conducting polymers, and graphene, have been deposited onto OPV active layers as back electrodes to achieve a solution-processable TOPV or s-TOPV. However, due to the absence of efficient solution processable transparent conductors and effective device architectures, these demonstrations often result in low device performance. Therefore, there remains a need for improved organic electro-optic devices.

SUMMARY

An electro-optic device according to some embodiments of the current invention includes a first electrode, an active layer formed over and electrically connected with the first electrode, a buffer layer formed over and electrically connected with the active layer, and a second electrode formed directly on the buffer layer. The second electrode includes a plurality of nanowires interconnected into a network of nanowires. The buffer layer provides a physical barrier between the active layer and the plurality of nanowires to prevent damage to the active layer while the second electrode is formed.

A method of producing an electro-optic device according to some embodiments of the current invention includes forming an active layer on a substructure, forming a buffer layer over and electrically connected with the active layer, and forming an electrode directly on the buffer layer. The active layer includes a bulk heterojunction organic semiconductor. The electrode includes a plurality of nanowires interconnected into a network of nanowires. The buffer layer provides a physical barrier between the active layer and the plurality of nanowires to prevent damage to the active layer during the forming of the electrode.

BRIEF DESCRIPTION OF THE DRAWINGS

Further objectives and advantages will become apparent from a consideration of the description, drawings, and examples.

DETAILED DESCRIPTION

Figure 1:
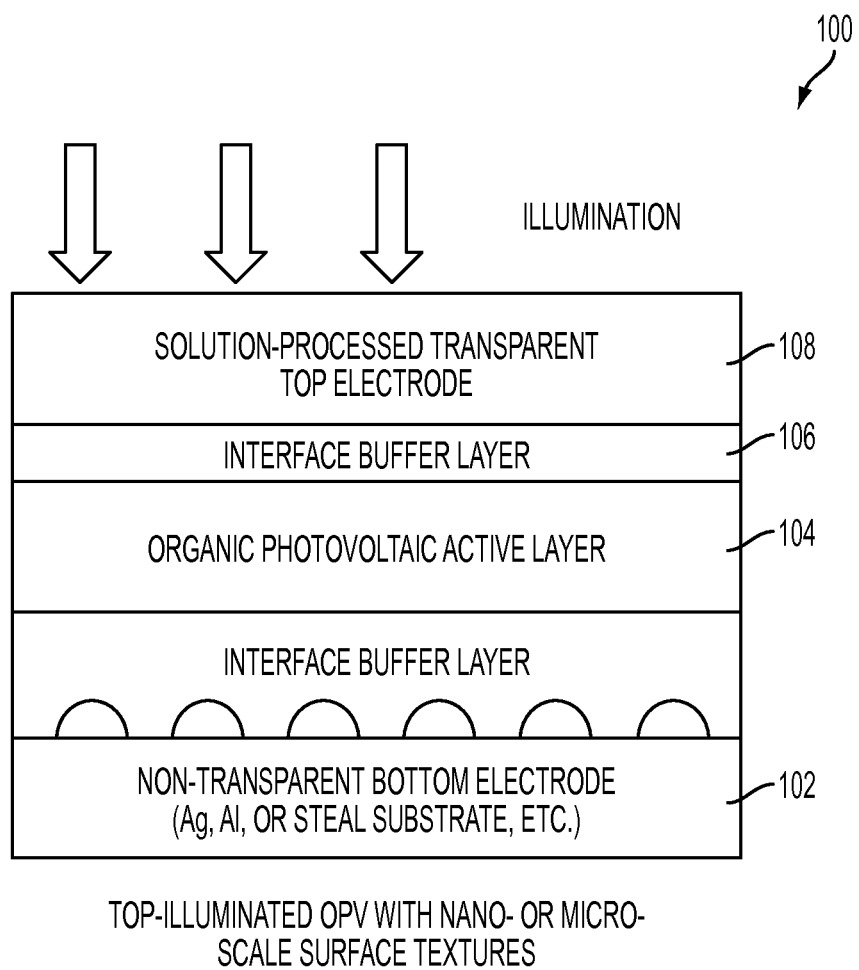
FIG. 1 is a schematic illustration of an electro-optic device according to an embodiment of the current invention.

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed and other methods developed without departing from the broad concepts of the current invention. All references cited anywhere in this specification, including the Background and Detailed Description sections, are incorporated by reference as if each had been individually incorporated.

The term "optically transparent" means that a sufficient amount of light within the wavelength range of operation can pass through for the particular application.

The term "light" is intended to have a broad meaning to include both visible and non-visible regions of the electromagnetic spectrum. For example, infrared and ultraviolet light are intended to be included within the broad definition of the term "light"

The term "nanowire" is intended to include any electrically conducting structure that has cross dimensions less than about 200 nm and a longitudinal dimension that is at least ten times greater than the largest cross dimension. In some cases, the longitudinal dimension can be one hundred times greater than the largest cross dimension, one thousand times greater than the largest cross dimension, or even more.

The term "nanoparticle" is intended to include any shape that has all outer dimensions less than about 200 nm.

The term "network of nanowires" is intended to refer to an arrangement of a plurality of nanowires such that there are multiple overlapping junctions between different nanowires. The nanowires within the network can be randomly or semi-randomly arranged, and can have a distribution of lengths, i.e., they do not have to be uniformly the same length. The network can be thought of as being similar to a fabric, although not woven or tied together in a systematic manner. As an electrode, the plurality of nanowires in the network provide multiple electrical pathways from one edge of the network to the other such that breaking a relatively small number of junctions will still leave alternative electrical paths from one edge of the network to the other. The network of nanowires can thus be flexible as well as fault tolerant, somewhat analogous to a communications network, such as the internet.

The term "solution" is intended to have a broad meaning to include both components dissolved in a liquid as well as components suspended in a liquid. For example, nanoparticles and/or nanowires suspended in a liquid are considered to be within the definition of the term "solution" as used herein.

In order to realize TOPVs or s-TOPVs according to some embodiments of the current invention, the following features can be included: 1) an effective optically transparent conductor for both the bottom conductive substrate and the top electrical contact; 2) organic photovoltaic absorbers (transparent or semi-transparent) sandwiched between the two electrodes; 3) transparent electrical buffer layers as efficient charge transferring media at the anode and/or cathode contact. We define the electrode deposited onto the active layer as "top electrode" and the electrode on which the active layer is coated, as the bottom electrode.

In co-pending application, we have demonstrated that conductive nanowires can be combined with metal oxide nanoparticles to achieve efficient transparent conductors. (See, International Application No. PCT/US2012/055214, titled "SOLUTION PROCESS FOR IMPROVED NANOWIRE ELECTRODES AND DEVICES THAT USE THE ELECTRODES", filed Sep. 13, 2012; and International Application No. PCT/US2012/060276, titled "SOLUTION PROCESSED NANOPARTICLE-NANOWIRE COMPOSITE FILM AS A TRANSPARENT CONDUCTOR FOR OPTO-ELECTRONIC DEVICES", filed Oct. 15, 2012; the entire contents of which are hereby incorporated by reference.) For example, we have demonstrated that $TiO_2$ or Indium-Tin-Oxide (ITO) nanoparticles can be combined with silver nanowire (AgNW) conductive networks to achieve an effective transparent conductive electrode. These electrodes have been used as transparent conductors in several photovoltaic devices. For example, we have used them as the bottom contacts for polymer solar cells. We also used them as the window layer in the $CuInS_xSe_{2-x}$ (CISS) and $CuIn_xGa_{1-x}Se_2$ (CIGS) solar cells.

According to some embodiments of the current invention, we combined metal nanowire networks with metal oxide nanoparticles to form solution-processed AgNW-based composite transparent conductors. We then processed these transparent conductors onto the organic or polymeric photovoltaic active layers as the top electrodes under mild processing conditions (low thermal treatment temperature of <160° C.). Finally, we achieved high-performance, transparent or semi-transparent organic photovoltaic devices. Some embodiments of the current invention involve three parts: 1) a novel processing method of AgNW-based composites onto organic or polymeric photovoltaic active layers under mild conditions; 2) the design of TOPV, s-TOPV and related device structures, and 3) the interface engineering between the active layer and the electrodes. However, the broad concepts of the current invention are not limited to these particular examples.

FIG. 1 is a schematic illustration of an electro-optic device 100 according to an embodiment of the current invention. The electro-optic device 100 includes a first electrode 102, an active layer 104 formed over and electrically connected with the first electrode 102, a buffer layer 106 formed over and electrically connected with the active layer 104, and a second electrode 108 formed directly on the buffer layer 106. The second electrode 108 comprises a plurality of nanowires interconnected into a network of nanowires and the buffer layer 106 provides a physical barrier between the active layer 104 and the plurality of nanowires to prevent damage to the active layer 104 while the second electrode 108 is formed. For example, when the plurality of nanowires are deposited, such as, but not limited to, spray deposition, they could penetrate or otherwise damage the active layer 104 if they were to be deposited directly on the active layer 104. In some embodiments, the buffer layer 106 is at least 1 nm thick. In some embodiments, the buffer layer is at least 1 nm thick and less than 1000 nm thick. In some embodiments, the buffer layer at least 30 nm thick and less than 51 nm thick. In addition, the buffer layer 106 provides an electrical function in addition to the physical (mechanical) function.

When we use the phrase "formed over", such as "active layer 104 formed over and electrically connected with the first electrode 102", we mean this can be formed directly on that layer, or could have one or more layers or other intermediate structures. Also, the broad concepts of the current invention are not limited to only the embodiment illustrated in FIG. 1. In some embodiments, both electrodes can be transparent. In addition, more than two electrodes and/or more than one active layer can also be included.

In some embodiments, the plurality of nanowires interconnected into the network of nanowires have electrically connected junctions at overlapping nanowire portions and define spaces void of the nanowires, and the second electrode further includes a plurality of nanoparticles disposed to at least partially fill a plurality of the spaces to provide additional electrically conducting pathways for the network of nanowires across the spaces. The plurality of nanoparticles can be electrically conducting nanoparticles, semiconducting nanoparticles, or combinations thereof. In some embodiments, the plurality of nanoparticles can be substantially optically transparent nanoparticles, and the network of nanowires and the plurality of nanoparticles form at least a portion of an optically transparent electrode of the electro-optic device. In some embodiments, at least some of the plurality of nanoparticles fuse junctions of overlapping nanowires together to reduce electrical sheet resistance of the network of nanowires. In some embodiments, the buffer layer 106 itself includes electrically conducting and optically transparent nanoparticles. In some embodiments, electro-optic device 100 can also include a polymer layer at least one of encapsulating the layer of nanowires and the plurality of nanoparticles or can be intermixed with at least one of the layer of nanowires and the plurality of nanoparticles to form a composite polymer-nanowire-nanoparticle layer.

In some embodiments, the plurality of nanoparticles can include at least one of a metal oxide, a conducting polymer, graphene, or fluorine-doped tin oxide. In some embodiments, the plurality of nanoparticles can include at least one metal oxide selected from the group of metal oxides consisting of indium tin oxide, tin oxide, zinc oxide, aluminum zinc oxide, indium zinc oxide, vanadium oxide, and cerium oxide.

In some embodiments, the plurality of nanowires include at least one of carbon nanotubes or metal nanowires. In some embodiments, the metal nanowires include at least one of silver, gold, copper, or aluminum.

In some embodiments, the second electrode can include a plurality of nanowires interconnected into a network of nanowires. In any of the examples, the second electrode can be an optically transparent electrode.

In some embodiments, the active layer can be a bulk heterojunction organic semiconductor. In some embodiments, the electro-optic device can be a photovoltaic device that has an average transparency of at least 10% across the visible range of wavelengths 400 nm to 650 nm. In some embodiments, the electro-optic device can be a photovoltaic device that has an average transparency of at least 30% across the visible range of wavelengths 400 nm to 650 nm. In some embodiments, the electro-optic device can be a photovoltaic device that has an average transparency of at least 50% across the visible range of wavelengths 400 nm to 650 nm. In further embodiments, the electro-optic device can be a photovoltaic device that has an average transparency of at least 70% across the visible range of wavelengths 400 nm to 650 nm. Some applications may benefit from high transparency, while others may only need, or even require, partial transparency.

In some embodiments, the bulk heterojunction organic semiconductor can include a polymer that has a repeated unit having the structure of formula (I)

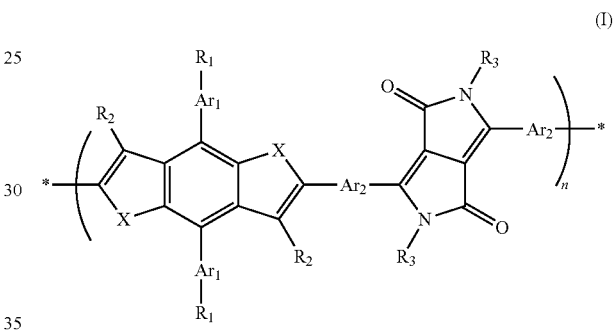

wherein $R_1$, $R_2$ and $R_3$ are independently selected from alkyl groups with up to 18 C atoms, aryls and substituted aryls; X is selected from Oxygen, Sulfur, Selenium and Nitrogen atoms; and $Ar_1$ and $Ar_2$ are each, independently, one to five monocyclic arylene, bicyclic arylene, and polycyclic arylene, monocyclic heteroarylene, bicyclic heteroarylene and polycyclic heteroarylene groups, either fused or linked. (For example, see International Application No. PCT/US2012/031265, titled "ACTIVE MATERIALS FOR ELECTRO-OPTIC DEVICES AND ELECTRO-OPTIC DEVICES", filed Mar. 29, 2012; the entire contents of which is incorporated herein by reference.) In some embodiments, $Ar_1$ and $Ar_2$ are independently selected from the group consisting of

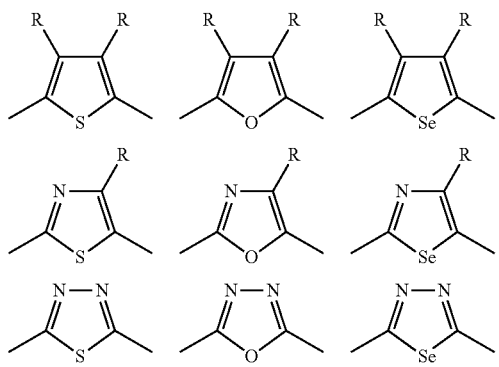

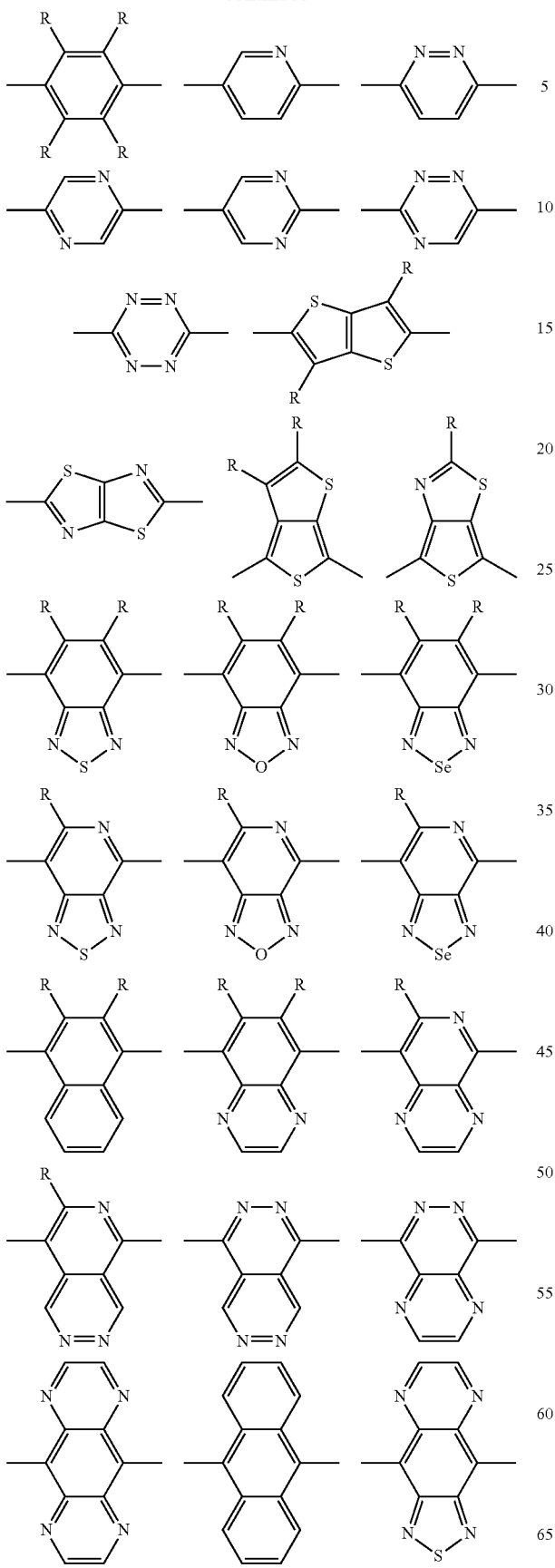

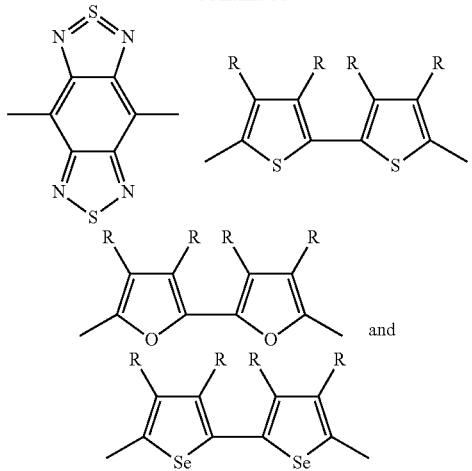

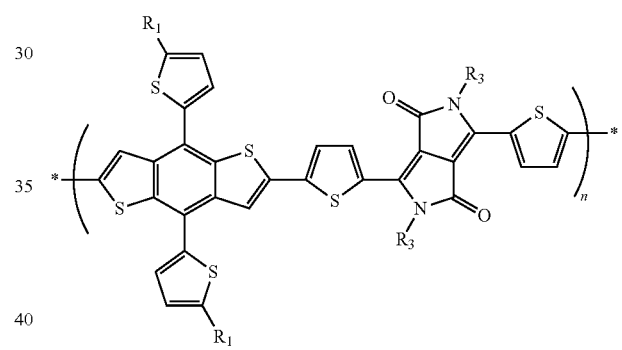

where, in the above structures, R is a proton, fluorine atom, $CF_3$, CN, $NO_2$, or alkyl group with carbon atom number of 1-18. In some embodiments, the repeated unit has the structure of formula (II).

$$\text{(II)}$$

where $R_1$ and $R_3$ are independently selected from alkyl groups with up to 18 C atoms, aryls and substituted aryls.

In some embodiments, $R_1$ and $R_3$ are independently selected from alkyl groups with 4 to 12 C atoms. In some embodiments, the $R_1$ is a 2-ethylhexyl group and $R_3$ is a 2-butyloctyl group.

In some embodiments, the buffer layer can be a p-type semiconductor and the electro-optic device is a photovoltaic device with an inverted device structure. In some embodiments, the buffer layer can be an n-type semiconductor and the electro-optic device is a photovoltaic device with a regular device structure.

A method of producing an electro-optic device according to some embodiments of the current invention includes forming an active layer on a substructure, forming a buffer layer over and electrically connected with the active layer, and forming an electrode directly on the buffer layer. The active layer includes a bulk heterojunction organic semiconductor. The electrode includes a plurality of nanowires interconnected into a network of nanowires, and the buffer layer provides a physical barrier between the active layer and the plurality of nanowires to prevent damage to the active layer during the forming the electrode. In some embodiments, the forming the active layer, the buffer layer, and the electrode are all solution processes. In some embodiments, the forming the electrode can be performed at a temperature less than 160° C.

The following describes some further embodiments in more detail. Some embodiments of the current invention can provide an efficient top contact onto a soft organic or polymer photovoltaic active layer. This can help to achieve visually transparent or semi-transparent OPV devices, top-illuminated OPV devices, or stacked OPV devices, for example. However, the broad concepts of the current invention are not limited to these examples. For example, other applications could include, but are not limited to, photodiodes, light emitting diodes, etc.

Figure 2:
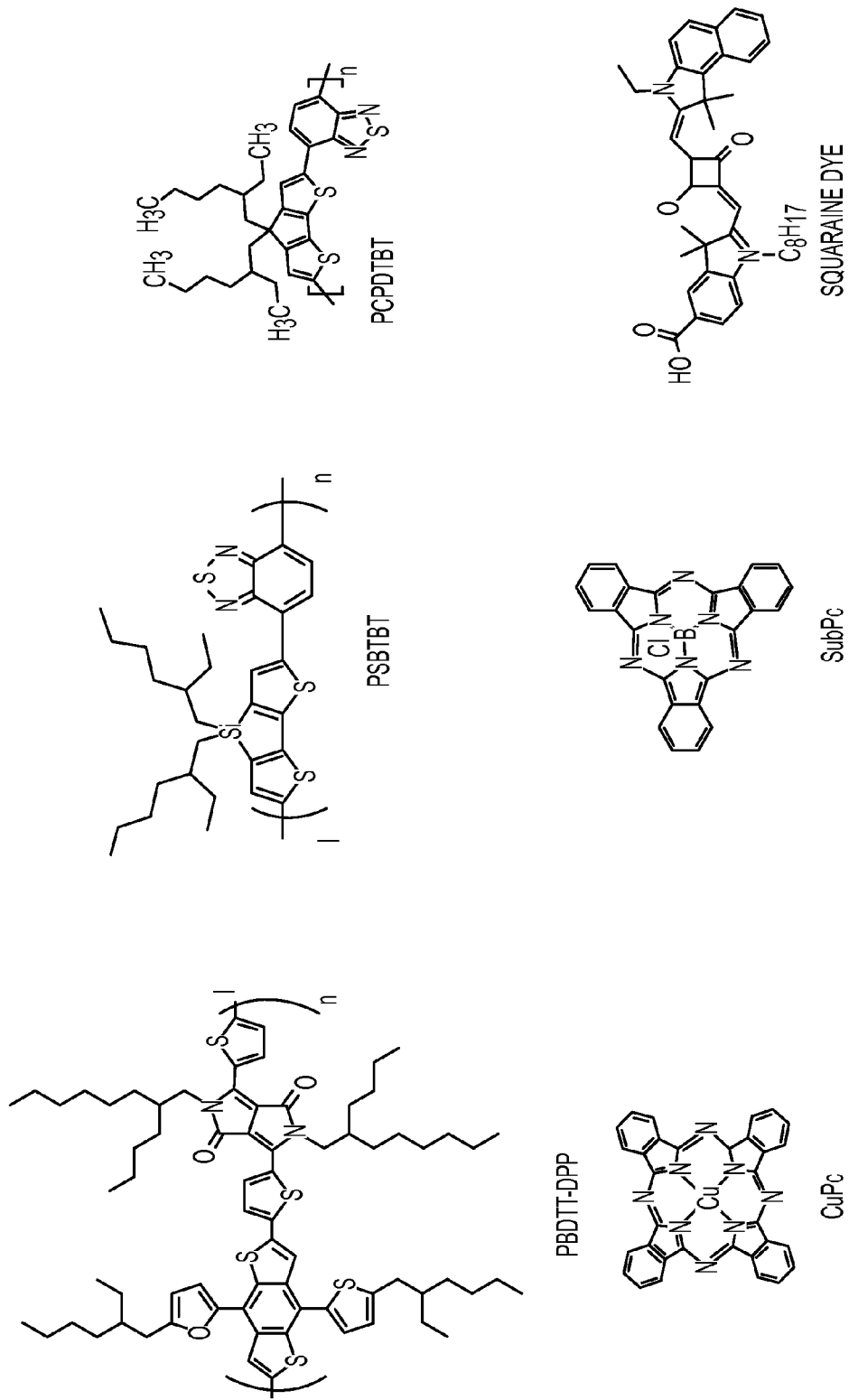
FIG. 2 shows examples of some organic photovoltaic materials that can be used for visually semi-transparent or transparent organic photovoltaic devices according to some embodiments of the current invention.
Figure 3:
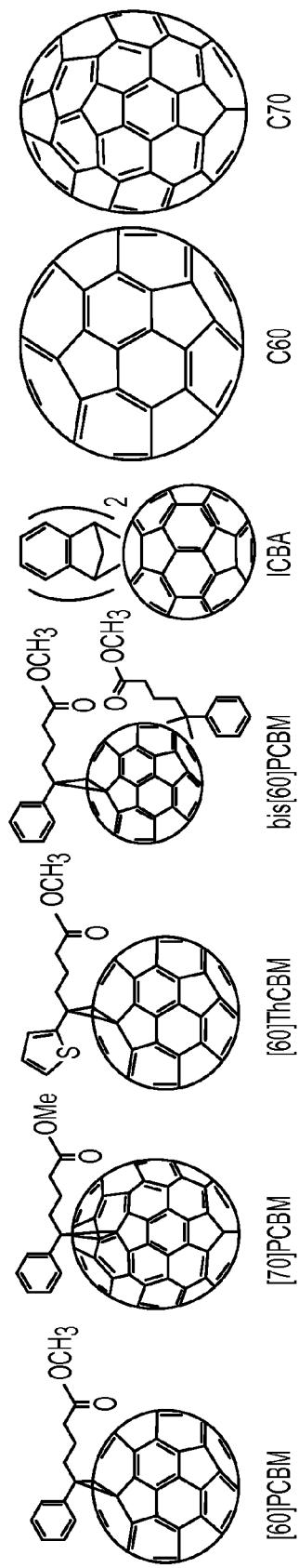
FIG. 3 shows examples of some n-type organic photovoltaic materials that can be used for visually semi-transparent or transparent organic photovoltaic devices according to some embodiments of the current invention.

In some embodiments, the devices include organic photoactive materials or their blends as absorbers. The organic absorbers can include polymer, oligomer, and small-molecule photovoltaic materials. In some embodiments, a visibly semi-transparent or transparent polymer absorber can be characterized by the optical bandgap. For example, any organic conjugated material films with an average transparency within the visible light region (400 nm~650 nm) ($T_{ave-vis}$) of >0% can be the potential absorbers for semi-transparent organic solar cells. If the material has a $T_{ave-vis}$ of ≥50%, it will be a good candidate for transparent organic solar cells. Examples of some polymeric photovoltaic materials are provided by, but not limited to, FIG. 2. These low bandgap polymers are capable of harvesting solar energy from 600 nm to 850 nm, at the same time, being highly transparent to the photons in visible region from 400 nm to 600 nm. This can be more suitable for transparent or semi-transparent organic photovoltaic devices. Also examples of some small molecules are provided by, but not limited to, those shown in FIG. 2. These materials can be evaporated or solution-processed as the photovoltaic active layers. All of the examples of organic absorbers are p-typed (electron donating) materials. To make an organic solar cell, an n-typed (electron accepting) material is required to provide a PN junction. Some suitable acceptor materials are characterized by LUMO level and HOMO level matching up to that of the organic absorber. Examples are shown in, but not limited to, FIG. 3.

In terms of processing of the organic materials, organic materials and acceptor materials can be dissolved in an organic solvent, such as benzene, chlorobenzene, dichlorobenzene, chloroform, THF, toluene and etc., and coated on top of the bottom electrode. The organic materials and acceptor materials can be either dissolved in the same solution and coated together, or dissolved in separate solutions and coated sequentially. The organic materials can also be processed by other coating methods other than solution processes. Examples include, but are not limited to, thermal evaporation, spray coating, slot-die coating, bar coating, screen printing, doctoral blade coating, etc.

Figure 4:
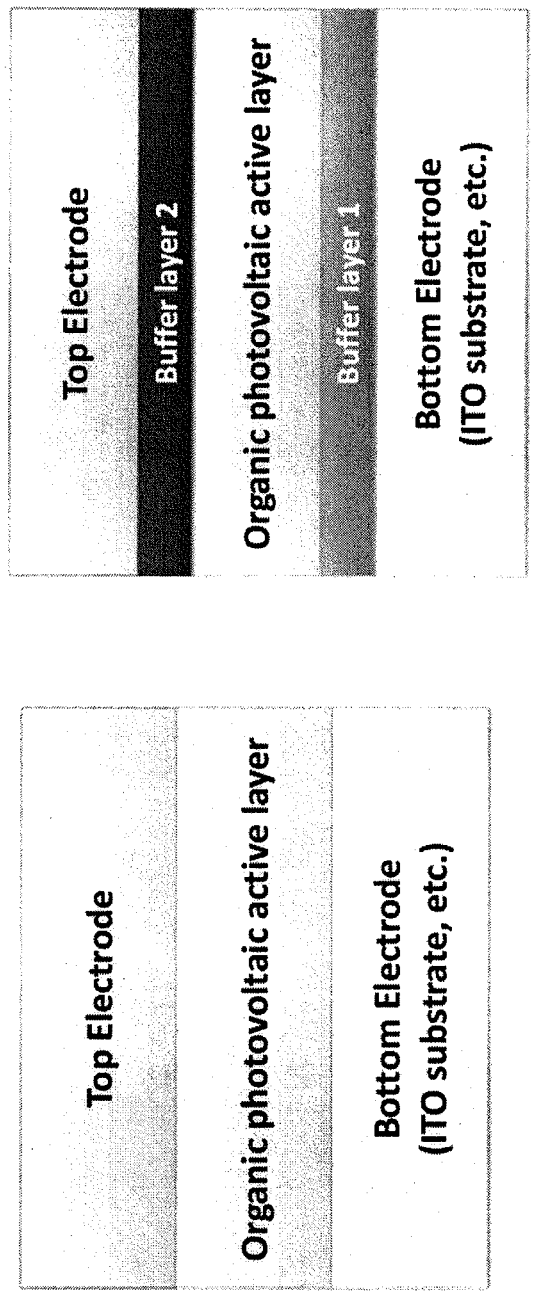
FIG. 4 is a schematic illustration of an electro-optic device according to an embodiment of the current invention.

In terms of device structure, there can be two electrodes, one on each side of the organic active layers to collect electricity. Example diagrams are provided in FIG. 4. To improve the contact between the electrode and organic active layers, electrical buffer layers can be applied between the electrodes and organic active layer. The electrical buffer layers do not only improve the electrical contact between layers, but also act as a protecting film for sublayer protection. For example, Buffer Layer 2 can prevent damage to the organic active layer during the process of depositing the top electrode.

In some embodiments, electrical buffer layers can be applied above organic materials, below organic materials, or both. Suitable electrical buffer layer materials can include metal oxides (examples include, but are not limited to, ZnO, $TiO_2$, $MoO_3$, $V_2O_5$, NiO, $WO_3$, etc.), aqueous polymers (examples include, but are not limited to, PEO, PEDOT:PSS, PANI, PANI:PSS, polypyrrole, conjugated polyelectrolyte, etc.) and salts (examples include, but are not limited to, $CsF_2$, LiF, $CsCO_3$, etc.)

In some embodiments, the electrical buffer layer can applied prior to the electrode deposition and on top of organic material to prevent damaging the organic materials. Methods of deposition of electrical buffer layers can include, but are not limited to, spin-coating, screen printing, spray coating, chemical vapor deposition, roll-to-roll printing, thermal evaporation, etc. The thickness of electrical buffer layer can be within the range of 1 nm to 1000 nm thick.

In some embodiments, the electrical buffer layer has sufficient electron (n-type) or hole transporting (p-type) ability, which can be represented in terms of high carrier mobility of electron or hole or both. Examples mentioned above can be either n-type or p-type electrical buffer layers. For example, ZnO and $TiO_2$ can be suitable for n-type electrical buffer layers. $MoO_3$, $V_2O_5$, NiO, and $WO_3$, can be suitable for p-type electrical buffer layers. Aqueous polymer such as PEDOT:PSS, PANI:PSS, and polypyrrole, can be suitable as p-type electrical buffer layers. Conjugated polyelectrolytes can be suitable for n-type or p-type electrical buffer layers. The combination of these materials can also be considered for the electrical buffer layer.

Figure 5:
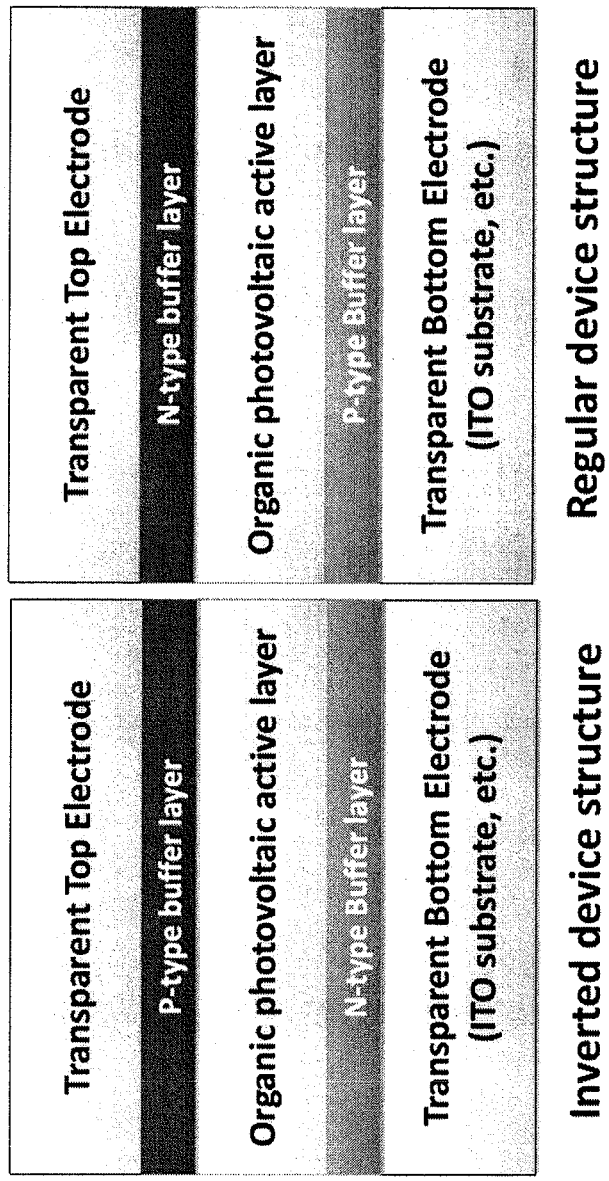
FIG. 5 is a schematic illustration of electro-optic devices according to further embodiments of the current invention.

In some further embodiments, either a p-type or n-type electrical buffer layer can be applied on the top of organic materials. When a p-type electrical buffer layer is applied on top of active layers, the device structure is known as an "inverted structure" of organic solar cell. When an n-type electrical buffer layer is applied on top of organic photovoltaic active layers, the structure is known as a "regular structure" of organic solar cell. FIG. 5 provides schematic illustrations of a regular structure and an inverted structure.

On the top of the electrical buffer layer, a transparent conductor can deposited by solution methods to provide the top electrode. Examples of solution methods can include, but are not limit to, spin-coating, screen printing, spray coating, chemical vapor deposition, and roll-to-roll printing, etc. Examples of transparent conductors that can be used for solution methods can include conducting 1-dimension (1-D) nanostructured materials. Examples of 1-D nanostructured materials can include, but are not limited to, silver nanowires, copper nanowires, gold nanowires, carbon nanotubes, etc. Examples of transparent conductors can also include, but are not limited to, a conducting network based on conductive nanoparticles (gold, silver, copper, platinum, doped zinc oxide, doped tin oxide, indium-tin-oxide, graphene), or composites of conductive nanowires and conductive nanoparticles.

In some embodiments, to improve the charge collection between the top transparent electrode and the active layer, a suitable interface layer can be used as described above. The space inside the conductive network can be filled with semiconducting or conducting nanoparticles or polymers, for example. Examples include, but are not limited to, indium-tin-oxide nanoparticles (ITO-np), $TiO_2$, ZnO, $V_2O_5$, $SnO_2$, PEDOT:PSS, PANI, etc. To improve the mechanical properties of the transparent electrodes, some polymer binders, thermal or UV light-cured epoxy can be combined with the nanoparticle. These can form composite electrodes with AgNW networks in one particular embodiment. The polymeric materials, such as epoxy, can also be coated onto the AgNW composite film as an encapsulation film to improve the device stability.

Figure 6:
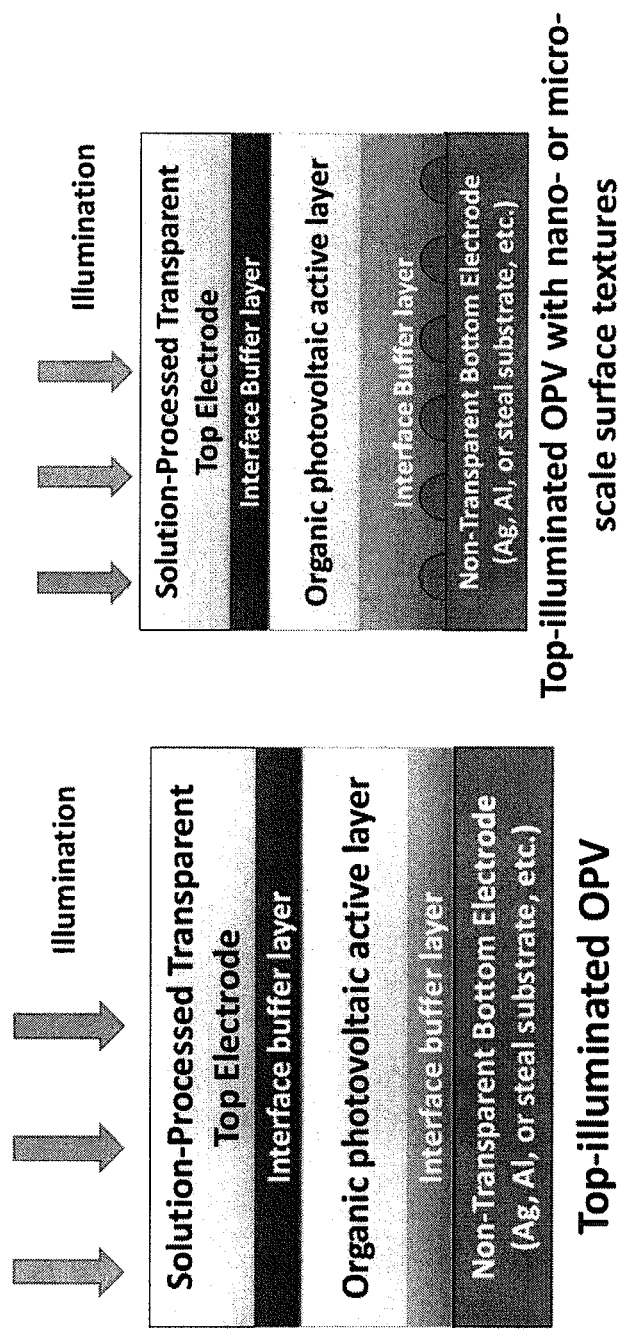
FIG. 6 is a schematic illustration of electro-optic devices according to further embodiments of the current invention.

In some embodiments, facile solution-processed transparent conductors can be used to prepare top-illuminated OPV devices. FIG. 6 provides schematic illustrations of structures of top-illuminated OPV devices according to some embodiments of the current invention. Nano-scale or micro-scale surface textures can also be incorporated onto the bottom electrode to improve the light absorption by increasing scattering.

Figure 7:
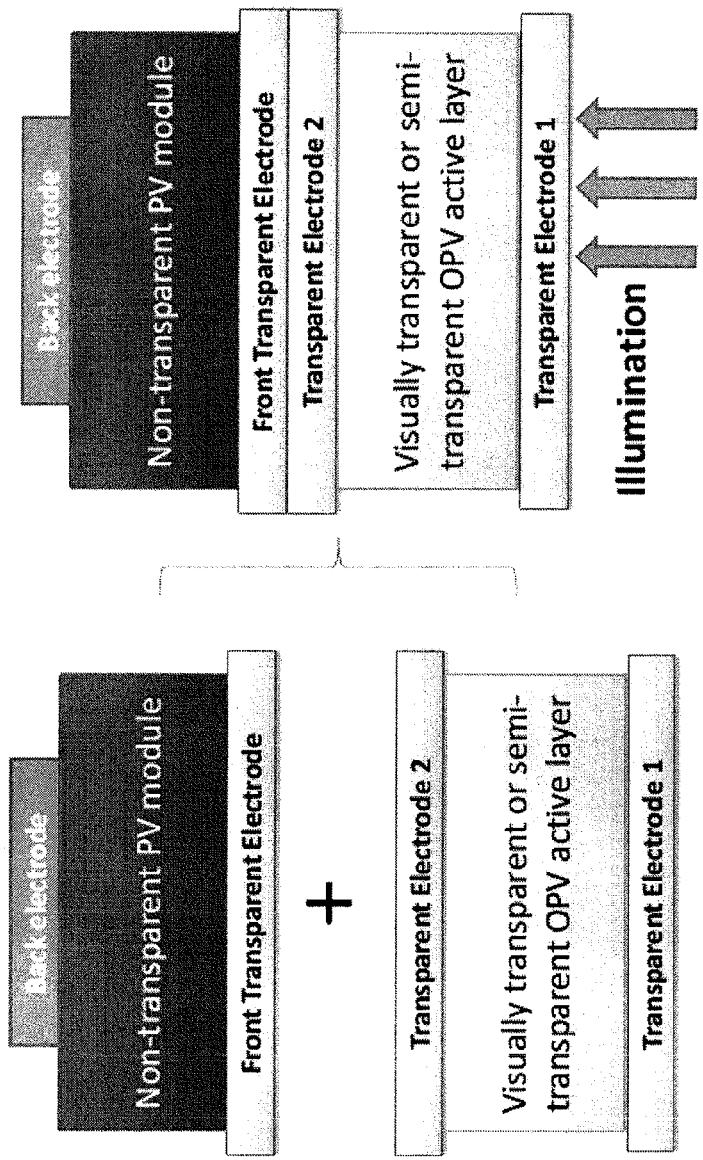
FIG. 7 is a schematic illustration of electro-optic devices according to further embodiments of the current invention.

In some embodiments, transparent or semi-transparent organic solar cells can be incorporated or stacked with other solar cells to obtain higher performance than the single solar cell alone. An example of a stacking structure is shown in FIG. 7. One or more visually semi-transparent or transparent OPV devices can be stacked onto other PV devices in series or parallel connections. These other PV devices can be either organic or inorganic solar cells. Examples include, but not limited to, silicon-based solar cells, CIGS or CZTS solar cells, and quantum dot solar cells. In addition, the active materials in each stacked layer can be different with different absorption characteristics. They can also be the same materials. Using the same materials can be useful to keep each layer thinner than a desired maximum, to improve charge collection, for example.

OPV devices according to some embodiments of the current invention can be integrated into buildings, portable electronics, etc. Examples can include, but are not limited to, building roof tops or windows, car windows, liquid crystal displays, light-emitting diodes, electrochromic devices, etc. The integrated devices can be used to harvest ambient light, sunlight energy or the backlight of a liquid crystal display, for example.

EXAMPLES

The following examples help explain some concepts of the current invention. However, the general concepts of the current invention are not limited to the particular examples.

Here we provided several examples of OPV devices according to some embodiments of the current invention.

Example 1

A PBDTTT-DPP+$PC_{60}BM$ blended film is utilized as the active layer for a visually transparent or semi-transparent OPV device with regular device structure (i.e., as opposed to inverted structure). Different interface electrical buffer layers are used. Table 1 provides a summary of the results.

Figure 8:
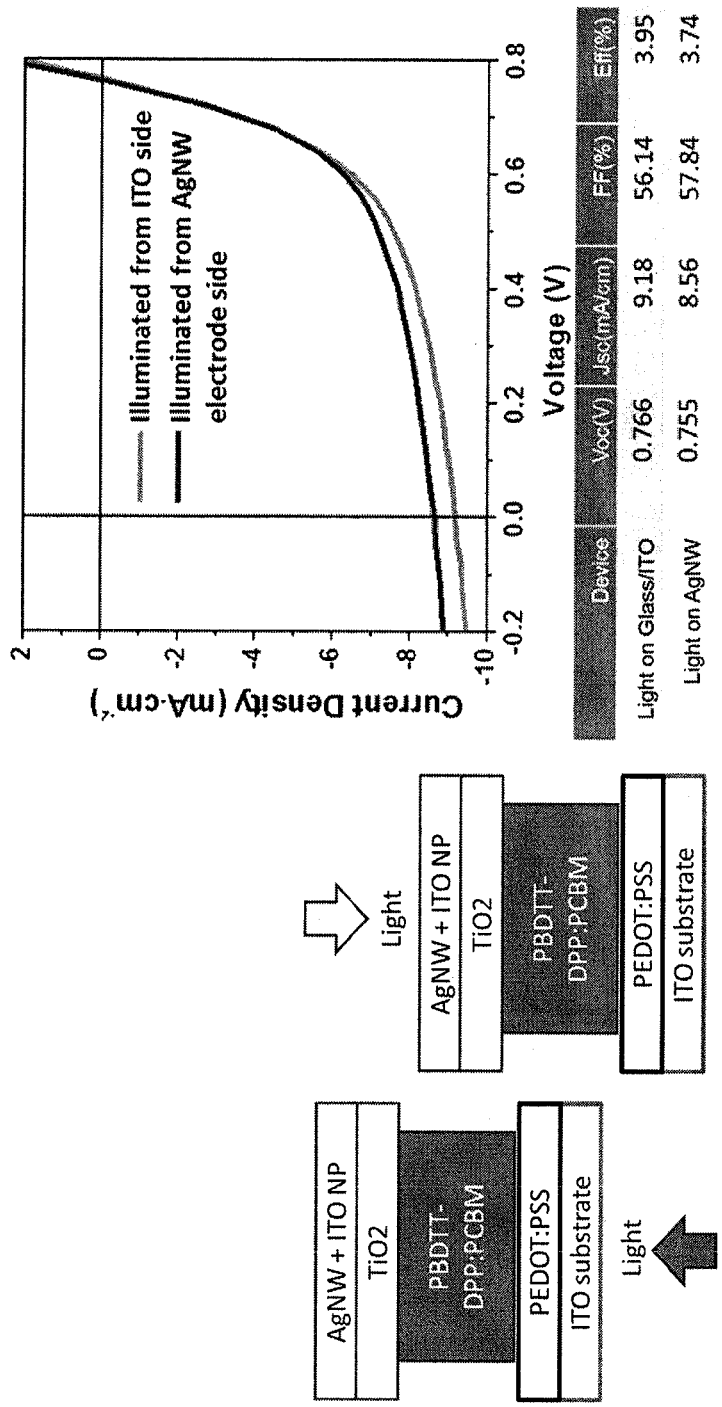
FIG. 8 shows an example including device performance data according to an embodiment of the current invention.
Figure 9:
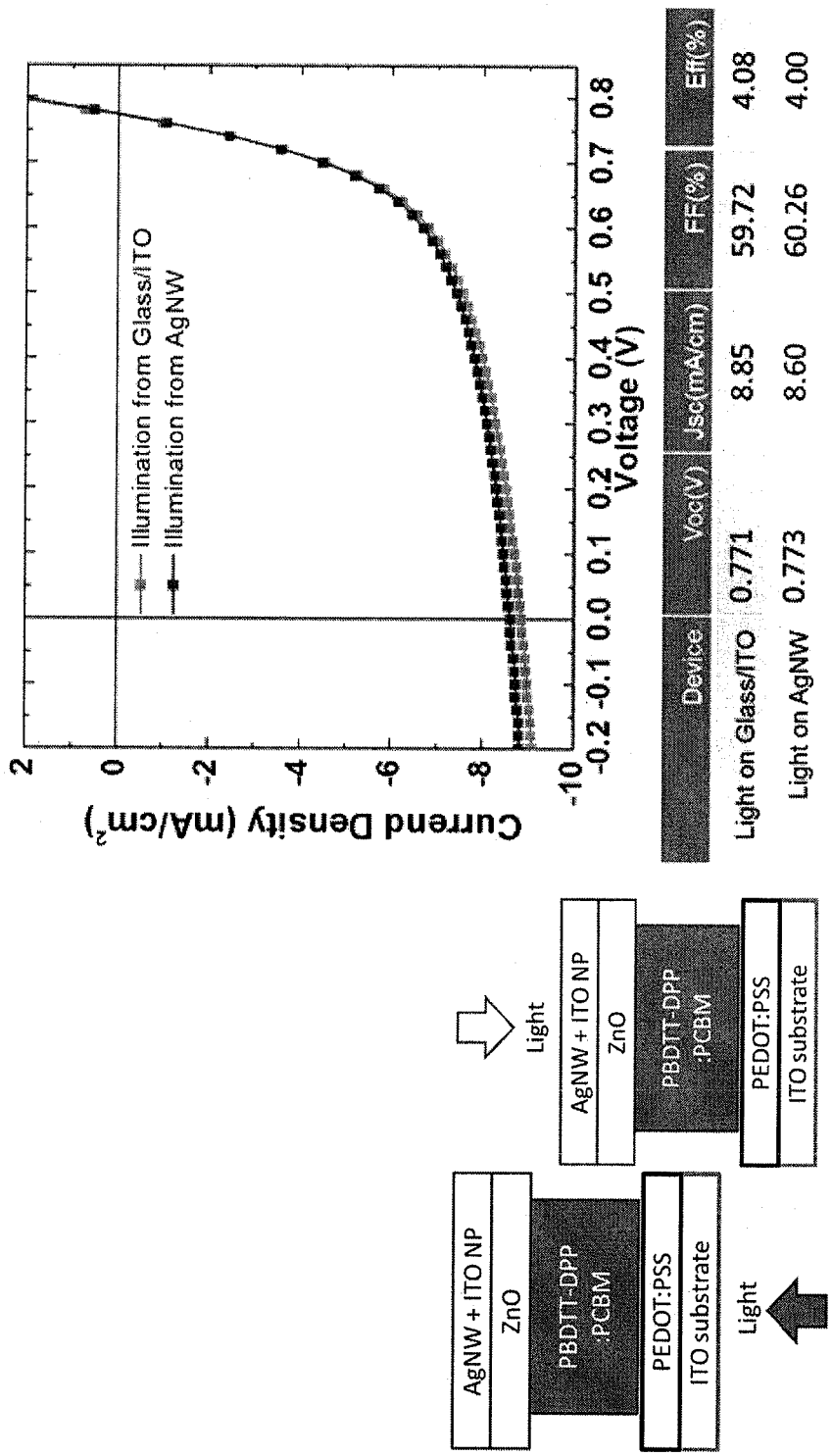
FIG. 9 shows an example including device performance data according to another embodiment of the current invention.
Figure 10:
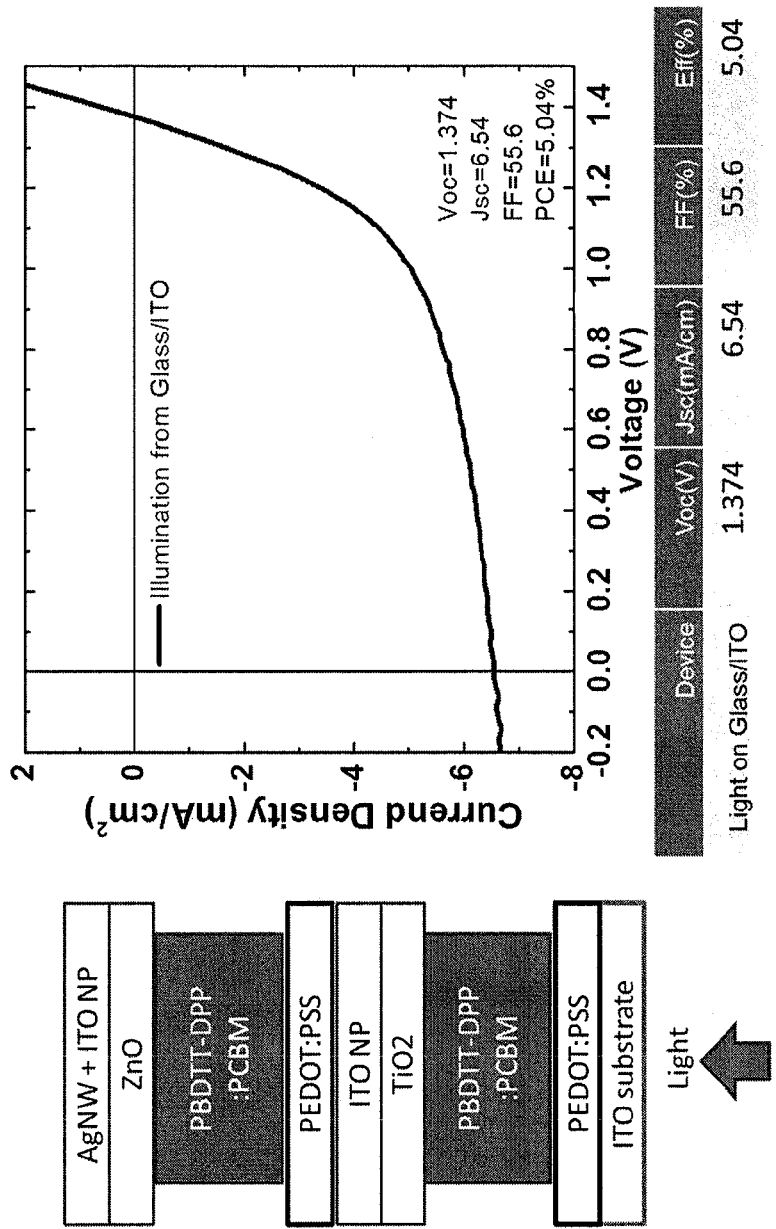
FIG. 10 shows an example including device performance data according to another embodiment of the current invention.

Structure 1:

Low bandgap polymer PBDTT-DPP (FIG. 2) and $PC_{60}BM$ (FIG. 3) is blended in dichlorobenzene solution and spin coated onto ITO glass which has been pre-coated with PEDOT:PSS as anode electrical buffer layer. $TiO_2$ sol gel solution is deposited on top of the organic layer to form a 30~50 nm thick protective layer before cathode layer formation. Silver nanowire is spray-coated or spin-coated from its isopropanol solution on top of $TiO_2$ layer to form the transparent conductor. Metallic nanoparticles (example is indium tin oxide (ITO)) solution (containing some polymer materials as binders. Examples of the polymers include, but are not limited to, polyethylene glycol (PEG), polyvinyl alcohol (PVA), polyvinylpyrrolidone (PVP), etc.) is spin coated on top of silver nanowire matrix to form a composite transparent conductor. The sheet resistance of the composite transparent conductor is as low as ~30 ohm/sq with a transmittance of ~90% at 550 nm. The average transparency of the whole device within 400~650 nm is ~70%. The power conversion efficiency of the transparent solar cell is 3.95%. FIG. 8 shows the device structure and the device performance.

Structure 2:

Use the same processes as those for Structure 1, but the $TiO_2$ sol-gel interface layer is replaced by ZnO sol-gel solution. The average transparency of the whole device within 400~650 nm is ~70%. The power conversion efficiency of the transparent solar cell is 4.08%.

Structure 3:

This is an inverted structure. ZnO is coated onto ITO glass substrate as n-type electrical buffer. Low bandgap polymer PBDTT-DPP and $PC_{60}BM$ is blended in dichlorobenzene solution and spin coated onto the ZnO layer. $MoO_3$ is deposited on top of the organic layer by vacuum thermal deposition to form a 15 nm thick protective layer. The AgNW composite electrodes are then deposited onto the $MoO_3$ layer to finish the device. The average transparency of the whole device within 400~650 nm is ~60%. The power conversion efficiency of this transparent solar cell is 3.3% when the light is illuminated from the ITO substrate side.

Structure 4:

This has a similar structure as Structure 3. The $MoO_3$ layer is replaced by a $V_2O_5$ layer. The average transparency of the whole device within 400~650 nm is ~60%. The power conversion efficiency of transparent solar cell is 3.5% when the light is illuminated from the ITO substrate side.

TABLE 1

Summary of device structure for transparent solar cell.

| Device Structure | Absorber | Top electrical buffer | Transparent Electrode | Average device Transparency (400-650 nm) | Power-conversion efficiency |
|---|---|---|---|---|---|
| 1 (regular) | | $TiO_2$ | Coating silver nanowire onto the top electrical buffer layer. Then, coat the ITO nanoparticle + Polyvinyl alcohol (PVA) composite film onto the AgNW matrix. | ~70% | 3.95% |
| 2 (regular) | | ZnO | | ~70% | 4.08% |
| 3 (inverted) | PBDTT-DPP:$PC_{60}BM$ | $MoO_3$ | | ~60% | 3.3% |
| 4 (inverted) | | $V_2O_5$ | | ~60% | 3.5% |
| 5. regular tandem device | PBDTT-DPP:$PC_{60}BM$ | ZnO | The same as above | ~50% | 5.04% |

Tandem Structure 1: Low bandgap polymer PBDTT-DPP and $PC_{60}BM$ is blended in dichlorobenzene solution and spin coated onto ITO glass which has been pre-coated with PEDOT:PSS as anode electrical buffer layer. $TiO_2$ sol gel solution is deposited on top of organic layer to form a 10 nm-30 nm thick protective layer. Metallic nanoparticle of indium tin oxide is spin coated on top of $TiO_2$ to form a transparent inter-connecting layer. PEDOT:PSS as anode electrical buffer layer for the second junction of organic transparent solar cell is spin coated on top of indium tin oxide layer and baked inside $N_2$ environment. The same low bandgap polymer PBDTT-DPP and $PC_{60}BM$ is blended in dichlorobenzene solution and spin coated on top of PEDOT:PSS following ZnO deposition from sol-gel. Silver nanowire is spray coated or spincoated from isopropanol solution on top of ZnO layer to form the transparent conductor. ITO nanoparticle (ITO NP)+polymer binder is then spin-coated on top of silver nanowire matrix to form a composite transparent conductor. The average transparency of the whole device within 400~650 nm is ~50%. The power conversion efficiency of this transparent solar cell is 5.04% when the light is illuminated from the ITO substrate side.

Further Examples

Polymer solar cells (PSCs) have drawn intense attention due to their advantages over competing solar cell technologies (1-3). Current progress in the power-conversion efficiency (PCE) of PSCs has reached a new record of 10.6% (3), demonstrating a promising future for PSCs as a low-cost and highly efficient photovoltaic (PV) candidate for harvesting solar energy. In addition to the pursuit of high device efficiency, PSCs are also intensely investigated for their potential in making unique advances in much broader applications (3-5). One of these applications is to achieve high-performance transparent PV devices, which will open up PV applications in many untapped areas such as building-integrated photovoltaics (BIPV) (6) or integrated PV-chargers for portable electronics (7). Previously, many attempts have been made in demonstrating transparent or semi-transparent PSCs (8-17). Transparent conductors, such as thin metal films, metallic grids, metal nanowire networks, metal oxide, conducting polymers, and graphene, were deposited onto PSC active layers as back electrodes to achieve transparent or semi-transparent solar cells. However, due to the absence of suitable polymeric PV materials and efficient transparent conductors, these demonstrations often result in either low visible light transparency or low device efficiency.

From the PV material point of view, an ideal active layer material for transparent PSCs needs to harvest most of the photons from ultraviolet (UV) and near-infrared (NIR) wavelengths in the solar spectrum, while the photons in the visible range should be transmitted. Since high power-conversion-efficiency (PCE) is strongly dependent on the amount of absorbed photons, there is often a compromise between captured photons and polymeric film transparency that limits materials development for transparent PSCs. For example, poly(3-hexylthiophene) (P3HT) is the most commonly-used active layer material in semi-transparent PSCs (11). However, due to efficient photon harvesting in the visible, P3HT (and many other) devices often have low transparency. On the other hand, the transparent conductor is also a key factor that affects the performance of transparent PSCs. An ideal transparent conductor for transparent PSCs must simultaneously pursue high transparency and low resistance together with ease of processing. However, a similar tradeoff also applies to these electrode materials, as high conductivity often sacrifices transparency (18). For example, thermally evaporated thin metallic films are commonly used as semi-transparent electrodes for PSCs, but the conductivity is significantly compromised by film transparency (9). Moreover, the vacuum-based deposition process also limits its wide application for mass production. Some recently developed solution-processable transparent conductors, such as carbon nanotubes (19, 20), graphene (21, 22), and silver nanowires (AgNWs) (23-26) have opened up a new era for transparent conductors. Despite the unique advantages of these candidates, they all have drawbacks limiting their applications in transparent PSCs. For example, one major drawback is the compatibility of these transparent conductors with soft polymer active layers. These include chemical, physical, mechanical, or energetic incompatibility between the polymer active layer and the transparent conductor. All of these issues lead to the low performance and/or low transparency of the transparent PSCs reported to date.

In these examples, we demonstrate a solution according to some embodiments of the current invention to overcome the aforementioned challenges for transparent PSCs. High-performance transparent PSCs are achieved by combining polymeric PV materials sensitive to NIR light but highly transparent to visible light, together with solution-processed high performance AgNW-based transparent conductors. Both visible light transparency and PCE are addressed simultaneously. Finally, a fully solution-processed and highly transparent solar cell is demonstrated with a PCE of 4% and a transmittance of ~75% at 550 nm.

Figure 11C:
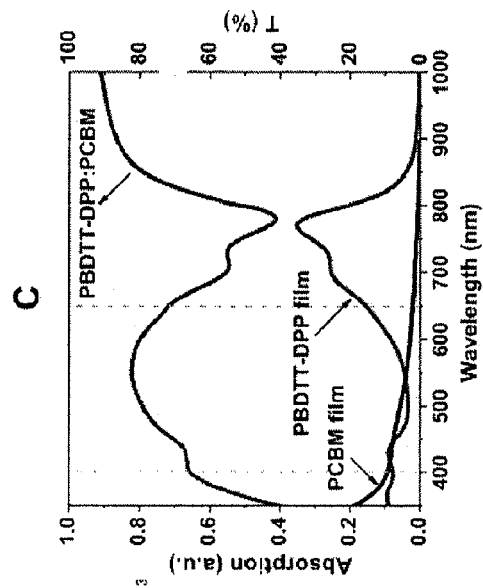
FIGS. 11A-11C show device architecture and materials for fully solution-processed transparent polymer solar cells according to an embodiment of the current invention. (A) Schematic of the device architecture. (B) Chemical structure of the donor (PBDTT-DPP) and acceptor (PCBM) materials used for the UV- and NIR-sensitive active layer. (C) Absorption spectra of PBDTT-DPP and PCBM, and transmission spectrum of the PBDTT-DPP:PCBM BHJ active layer. The dashed lines indicate the visible wavelength range.
Figure 11B:
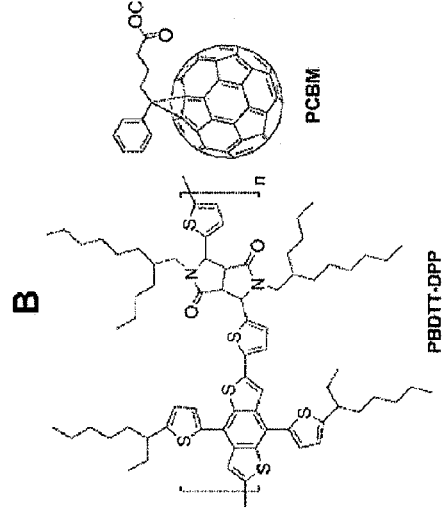
Figure 11A:
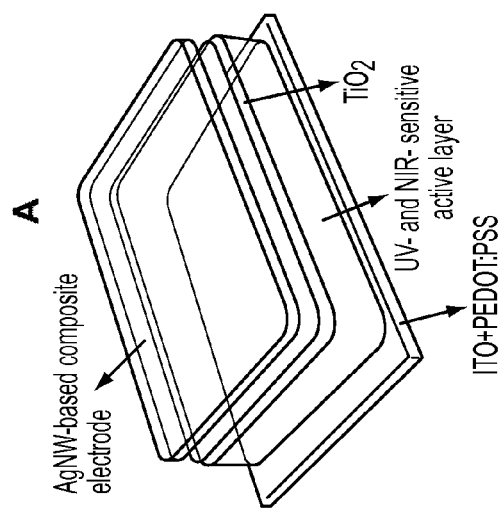

FIG. 11A shows the schematic structure of a transparent PSC according to an embodiment of the current invention. An UV and NIR light-sensitive photoactive layer is sandwiched between two transparent electrodes. The photoactive layer is a bulk hetero-junction (BHJ) blend consisting of a NIR light-sensitive PV polymer poly(2,6'-4,8-di(5-ethylhexylthienyl)benzo[1,2-b;3,4-b]dithiophene-alt-5-dibutyloctyl-3,6-bis(5-bromothiophen-2-yl)pyrrolo[3,4-c]pyrrole-1,4-dione) (PBDTT-DPP, FIG. 11B) (27) as the electron donor and phenyl-C61-butyric acid methyl ester (PCBM) as the electron acceptor. FIG. 11C shows the film absorption of PBDTT-DPP, PCBM, and their blend. PBDTT-DPP is a low band-gap polymer with strong photosensitivity in the range 650-850 nm, while the absorption of PCBM is located below 400 nm. With these two materials in combination, the PBDTT-DPP:PCBM active layer has a maximum transmission of 82% at ~550 nm and an average transmission of 76% over the entire visible range (400 to 650 nm), but is strongly absorbing in the NIR range (from 650 to 850 nm), as shown in FIG. 11C. This spectral coverage ensures the harvesting of UV and NIR photons while visible photons are transmitted, making for an excellent candidate for transparent PSCs.

Figures 12A, 12B, 12C, 12D, 12E:
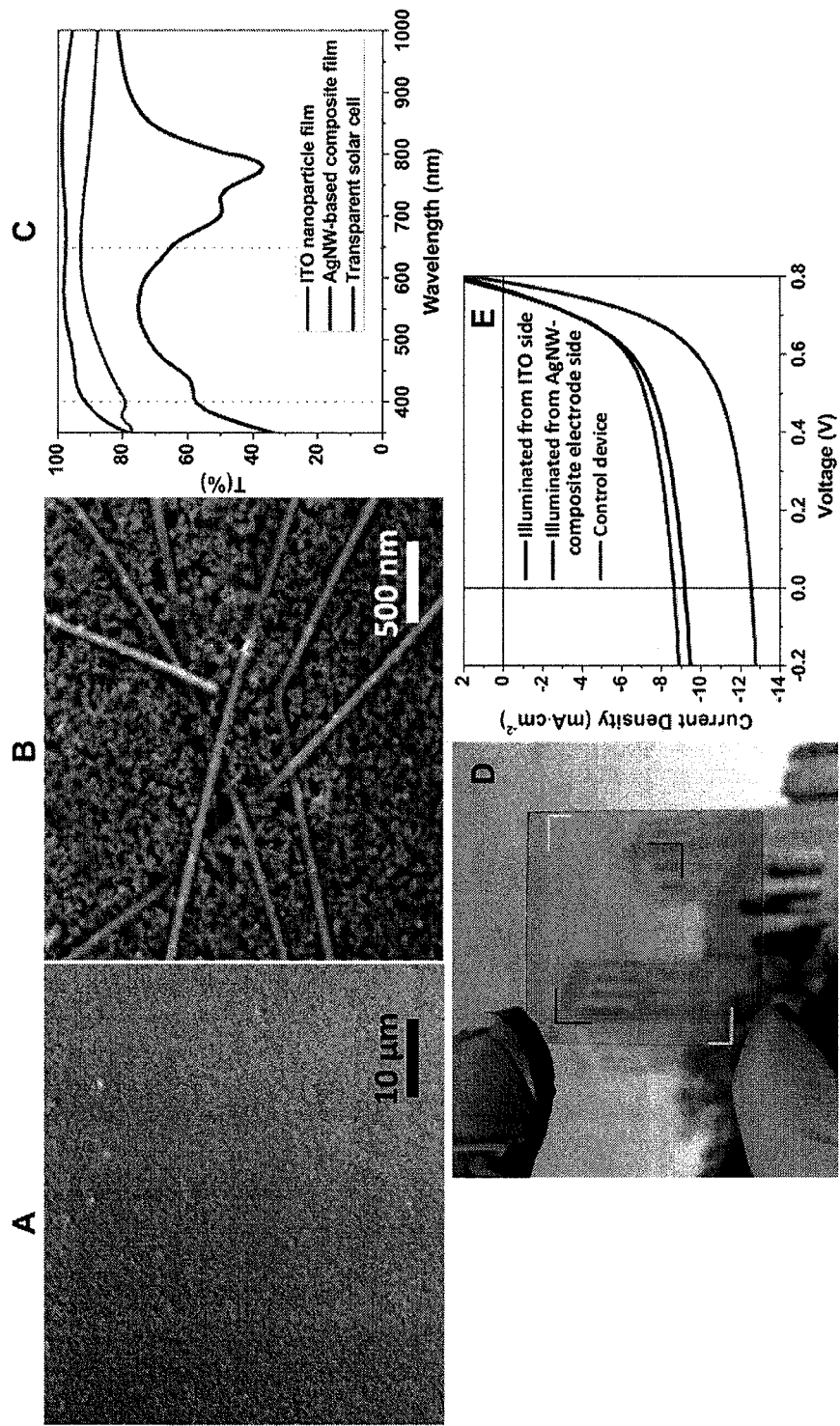
FIGS. 12A-12E show AgNW-based composite transparent conductor as the cathode for highly transparent polymer solar cells according to an embodiment of the current invention. (A, B) SEM images of the top and bottom surfaces of the AgNW-based cathode. (C) Transmission spectra of the pristine ITO nanoparticle film, the AgNW-based composite transparent conductor and the transparent solar cell. (D) Photograph of a transparent polymer solar cell. The yellow and blue brackets indicate the top AgNW-based composite electrode and the bottom ITO electrode, respectively. (E) Current density-voltage characterization of the transparent device (illuminated from ITO side or AgNW composite electrode side) and the control device (using reflective thermal-evaporated Al as cathode).

For transparent conductors, both the bottom (anode) and top (cathode) electrodes need high transparency to ensure the transmission of visible light. Commercial indium-tin-oxide (ITO) substrates can be chosen as the bottom anode electrode, which is often covered by poly(3,4-ethylenedioxythiophene):poly(styrene sulfonate) (PEDOT:PSS) as an anode modification layer. However, great challenges still exist for the high-performance transparent cathode that is deposited onto the active layer. The dominating reason is the aforementioned compatibility issues, because polymer or organic films are often too thin and soft to survive from the deposition process of many transparent conductors. To solve this problem, we use a spray-coated AgNW-based composite to achieve the high-performance top transparent cathode. The AgNW can be spray-coated onto the active layer through alcohol-based solvents, which are compatible with many PSC materials. The AgNW network is then fused using a TiO$_2$ sol-gel solution to enhance the connection between AgNWs and the adhesion of AgNWs to the active layers (26). This step is performed with mild processing conditions, and has good compatibility with the active layer. Due to the percolation feature of the AgNW conducting network (28), the empty space between AgNWs is filled with transparent conductive fillers. This conductive filler will extract the charges generated from areas that are not covered by AgNWs and transport these charges to the AgNW matrix. We chose indium-tin-oxide (ITO) nanoparticles as the filler for the AgNW network to form the AgNW-based composite transparent conductor. This ITO-based filling material consists of thermally curable materials that can improve the adhesion of AgNW networks onto the active layer and form a continuous film with good contact with the underlying active layer. FIG. 12A shows the scanning electron microscopic (SEM) image of the top surface of the AgNW-based composite electrode. It is clear that the AgNW networks are completely buried in the ITO nanoparticle-based conductive filling material, resulting in the smooth top surface. By using a "floating-off" technique (29), the composite transparent electrode can be flipped to expose the bottom surface, which is in contact with the underlying active layer. FIG. 12B shows the SEM image of the bottom surface of the composite transparent conductor. AgNWs on the bottom surface are still exposed to the active layer, which indicates that ITO nanoparticles did not diffuse into the contact area between AgNWs and the active layer, but only filled the extra space between AgNWs. FIG. 12C shows the transmittance spectra of the ITO nanoparticle film and the AgNW-based composite film. The ITO nanoparticle film (thickness ~400 nm) has good transparency within the visible and NIR range, with a sheet resistance of ~100 kΩ/sq. The pristine AgNWs film prepared from spray-coating methods has a resistance of >1 MΩ/sq. After treating with the TiO$_2$ sol-gel solution and coating by the ITO nanoparticle solution, the result AgNW composite film possesses an average transmittance of ~87% from 400 to 1000 nm with a sheet resistance of ~30 Ω/sq. These results can fulfill the requirements for the cathode of a transparent PSC.

Between the active layer and top electrode, a suitable interface modification layer is also critical. The interlayer can not only act as a protective film on the soft active layer, but can also improve the electrical contact between the active layer and top electrode. We use a TiO$_2$ nanoparticle sol-gel solution to form a 20-nm-thick TiO$_2$ nanoparticle cathode interfacial layer (30, 31). This layer prevents the silver nanowires from damaging the underlying soft films. Moreover, owing to its photoconductivity and proper work function alignment with the PV polymer material, the TiO$_2$ nanoparticle layer serves as an efficient electron-transporting layer and allows electrons to tunnel through the barrier into the AgNW-based electrode.

Figure 13:
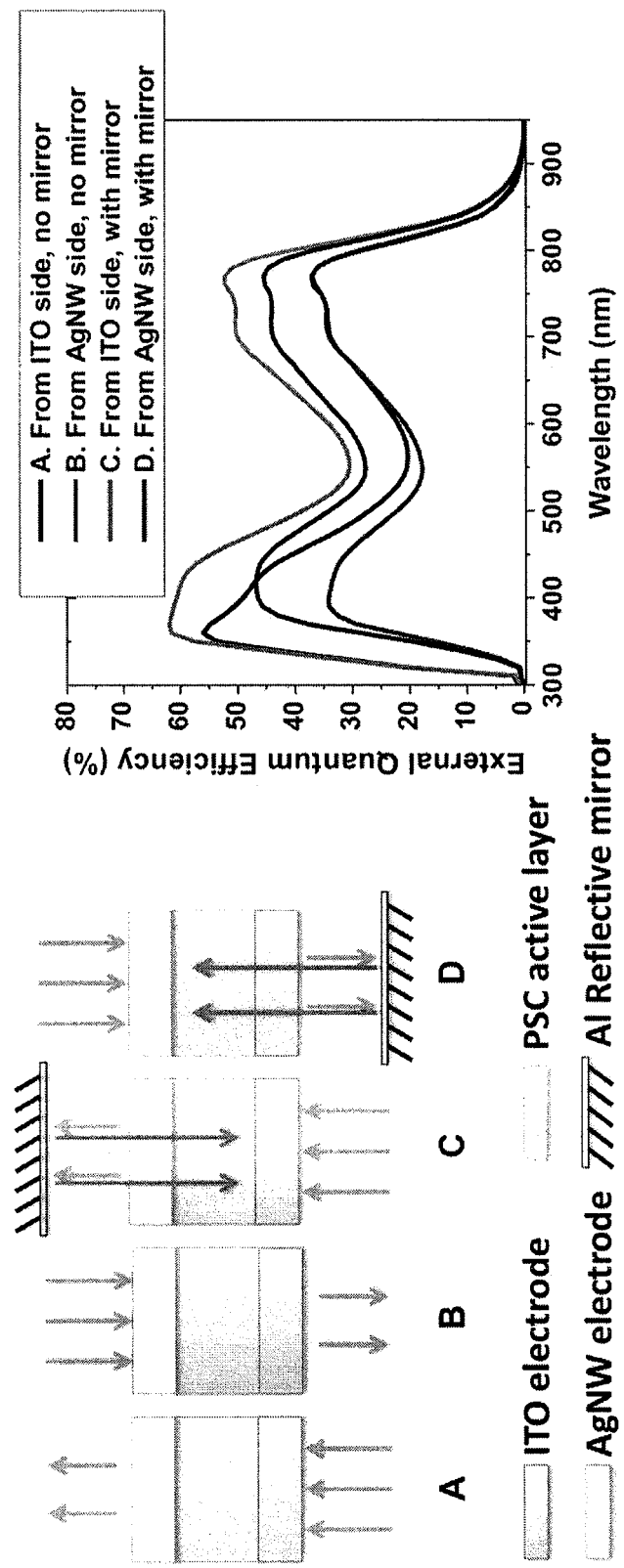
FIG. 13 shows external quantum efficiency (EQE) characterization of the transparent PSC according to an embodiment of the current invention. The incident light beam illuminated from both ITO (A) and AgNW (B) electrode sides were investigated. An Al-based reflective mirror was then placed at the back of the transparent device to reflect the transmitted photons back to the device (C and D) and the EQE spectra were also collected. The calculated $J_{sc}$ values based on the EQE results are: (A) 8.99 mA·cm$^{-2}$; (B) 8.24 mA·cm$^{-2}$; (C) 12.83 mA·cm$^{-2}$; (D) 11.01 mA·cm$^{-2}$.

Based on the above structure, we produce fully solution-processed transparent PSCs with an average light transmission of almost 70% over the 400 to 650 nm range (FIG. 12C, using ITO substrate as a baseline). FIG. 12D shows a photograph of a highly transparent PSC where the building behind can be clearly seen through the device. The yellow and blue brackets indicate the edge of the top AgNW-based composite electrode and the bottom ITO electrode, respectively. FIG. 12E demonstrates the current density-voltage (J-V) curves of the transparent PSC measured under simulated AM 1.5 G illumination with an intensity of 1000 W·m$^{-2}$. The performance of the control device is also shown in FIG. 12E, which uses evaporated Al as a reflective electrode. For the control device, a power conversion efficiency (PCE) of 5.82% was obtained with a short-circuit current density (J$_{sc}$) of 12.55 mA·cm$^{-2}$, an open-circuit voltage (V$_{oc}$) of 0.78 V, and fill factor (FF) of 59.5%. In testing transparent PSCs, we measured the device performance with illumination from either the ITO substrate side or the top AgNW-composite transparent conductor side. When illuminated from the ITO substrate side, a high PCE of 4.02% was achieved with V$_{oc}$=0.77 V, J$_{sc}$=9.3 mA·cm$^{-2}$, and FF=56.2%. In contrast, when the device test was performed with illumination from the top AgNW-composite transparent conductor side, similar performance was obtained: V$_{oc}$=0.76 V, J$_{sc}$=8.7 mA·cm$^{-2}$, FF=57.8%, and PCE=3.82%. Both measurements show similar open-circuit voltages (V$_{oc}$) and fill factors (FF). The only differences come from the short-circuit current density (J$_{sc}$), which is due to the slightly lower transparency of the AgNW-based composite films compared to the commercial ITO substrates. FIG. 13 shows the external quantum efficiency (EQE) characterization of the transparent PSCs. J$_{sc}$ can be calculated by integrating the EQE results with the solar spectrum. The J$_{sc}$ obtained by EQE illumination from the ITO and AgNW sides are 8.99 and 8.32 mA·cm$^{-2}$, respectively. These values are roughly consistent with the results obtained from the J-V characterization. If a reflective mirror were placed at the back of the transparent PSC to reflect the transmitted photons back to the device, as illustrated in C and D of FIG. 13, the calculated J$_{sc}$ are 12.83 and 11.01 mA·cm$^{-2}$. These results show that the photons transmitted through the transparent PSCs can be utilized for energy generation or other optical applications, indicating the broad applications of transparent PSCs.

TABLE 2

Summary of some reported transparent or semi-transparent organic solar cells.

| References | Electrode | T$_{act}$ (550 nm) | PCE$_{act}$ | PI |
|---|---|---|---|---|
| (14) | Sputtered ZnO:Al | 25% | 2.8% | 3.37 |
| (17) | Sputtered ZnO:Al | <20% | 3.9% | <3.75 |
| (11) | Laminated graphene film | <10% | 2.5% | <1.20 |
| (10) | Laminated conducting polymer | <15% | 3.2% | <2.31 |
| (12) | Conducting polymer + silver grid | <40% | 1.95% | <3.75 |
| (9) | Evaporated thin metal or sputtered ITO film | <40% | 1.7% | <3.27 |
| (13) | Laminated AgNW + conducting polymer | 20% | 2.5% | <2.40 |
| (15) | Sputtered ITO | 60% | 1.7% | <4.90 |
| (16) | Evaporated thin Ag film | ~60% | 2.5% | <7.21 |
| This work | Solution-processed AgNW-based electrode | 75% | 4.02% | 14.50 |

Although transparent or semi-transparent solar cells have been frequently demonstrated, there is still a lack of a figure-of-merit to evaluate device performance. The evaluation of a transparent solar cell needs to consider not only the PCE value, but also take into account the overall transparency in the visible. Here, we propose a parameter, which we call the transparent solar cell Performance Index (PI) so that we can evaluate the overall performance of a transparent solar cell. In short, the PI is a relative value from 0-100 that compares the transparency and the PCE of an actual device with the corresponding values of the ideal case. The PI is expressed as:

$$PI = 100 \times \eta_{T(\lambda)} \times \eta_{PCE} = 100 \times \frac{T_{act}(\lambda)}{T_{ideal}} \times \frac{PCE_{act}}{PCE_{ideal}}$$

where η is the relative value of an actual transparent device compared to the value in an ideal transparent solar cell, T$_{act}$ (λ) is the percent transmittance in the visible of the actual device, and $PCE_{act}$ is the power conversion efficiency of an actual device. $T_{ideal}$ and $PCE_{ideal}$ are the values for an ideal transparent solar cell. For the ideal transparent solar cell, the photons within visible light region (~400-650 nm) should be completely transmitted, while the electricity is generated by photons in the UV and IR regions. This will give a $T_{ideal}$ of 100% from 400-650 nm and a $PCE_{ideal}$ of 20.8% using Shockley-Queisser theory (32).

Based on the PI analysis, some representative reported transparent or semi-transparent organic solar cells are evaluated and compared in Table 2. We choose transparency at 550 nm for our PI calculations for comparison purposes and because 550 nm is near the central wavelength of visible region; however, the $PCE_{ideal}$ value still assumes 100% across the visible range. For the reported cases with a variety of electrodes materials, the PIs are all around or lower than 10. In contrast, the PI of this work can reach as high as 14.5, by far the highest value for transparent solar cells. Moreover, the entire device was processed using fully solution-based approaches, which can be easily deployed in mass production.

Materials:

The near-infrared (NIR) light-sensitive active polymer is poly[2,6'-4,8-di(5-ethylhexylthienyl)benzo[1,2-b;3,4-b] dithiophene-alt-5-dibutyloctyl-3,6-bis(5-bromothiophen-2-yl)pyrrolo[3,4-c]pyrrole-1,4-dione] (PBDTT-DPP), which was developed in our laboratory (S1). [6,6]-phenyl $C_{61}$-butyric acid methyl ester (PCBM) was purchased from Nano-C (Westwood, Mass., USA). Poly(3,4-ethylenediox-ythiophene)/poly(styrenesulfonate) (PEDOT:PSS, CLEVIOS™ P VP Al 4083) was purchased from H. C. Starck (Newton, Mass., USA). $TiO_2$ nanoparticle solution was prepared according previous report (S2). Silver nanowires (AgNW) were purchased from BlueNano Inc. (Charlotte, N.C., USA) or Kechuang Advanced Materials Co., Ltd (Hangzhou, Zhejiang, China). Indium-tin-oxide nanoparticle dispersion was purchased from Aldrich (Milwaukee, Wis., USA) or obtained as a gift from Evonik Degussa Corporation (Piscataway, N.J., USA).

Device Fabrication:

The device structures are: (a) transparent polymer solar cells: ITO/PEDOT:PSS/PBDTT-DPP:PCBM/$TiO_2$/AgNW composite electrode; (b) control device: ITO/PEDOT:PSS/PBDTT-DPP:PCBM/$TiO_2$/Al. Transparent polymer solar cells (a) were fabricated on patterned indium tin oxide (ITO)-coated glass substrates with a sheet resistance of 15 Ω/square. The PEDOT:PSS layer was spin-casted at 4000 rpm for 60 s and annealed at 120° C. for 15 min in air. The PBDTT-DPP:PCBM blend with a weight ratio of 1:2 in dichlorobenzene solution (0.7 w.t. %) was spin-casted at 2500 rpm for 80 s on top of the PEDOT:PSS layer to form ~100 nm thick active layer. A thin layer of $TiO_2$ solution was then spin-coated onto the active layer at 2500 rpm for 30 s and annealed at 100° C. for 1 min to form the n-type interface layer. For the deposition of a silver-nanowire-based composite electrode, the silver nanowire dispersion in isopropyl alcohol (IPA) was spin-coated (2 mg/mL dispersion, 2500 rpm, 10 drops) or spray-coated (0.05 mg/mL dispersion) onto the $TiO_2$ layer to form the silver nanowire conducting networks. (S3) The fusing process of the silver nanowire network was then carried out by applying diluted $TiO_2$ sol-gel solution in ethanol at 3000 rpm and baking for 100° C. for 30 s. ITO nanoparticle dispersion (10 wt. %) was used as transparent conductive filler, which was spin-coated onto the fused AgNW matrix to form the composite electrode. Mild heating at 80° C. for 1 min was applied to remove the residual solvent. The thickness of the transparent composite electrode is around 400 nm. The device electrode fingers were formed by cutting the films with a blade and blowing the devices with $N_2$ to avoid possible short-circuits between AgNWs and the bottom ITO substrate. The active area is 10 $mm^2$, which is defined by the overlap between bottom ITO substrate and the top fingers. For control device (b) with an evaporated reflective Al electrode, the devices were completed by thermal evaporation of 100 nm Al as the cathode under vacuum at a base pressure of $2 \times 10^{-6}$ Torr after the deposition of polymer active layer.

Optical and Electrical Characterization:

The transmission spectra were recorded using a Hitachi ultraviolet-visible U-4100 spectrophotometer (Hitachi High-Technologies Corporation, Tokyo, Japan). Current density-voltage characteristics of photovoltaic cells were measured using a Keithley 2400 source unit (Keithley Instruments, Inc., Cleveland, Ohio, USA) under a simulated AM1.5 G spectrum with an Oriel 91191 solar simulator (Newport Corporation, Irvine, Calif., USA). The light intensity was ~100 mW·$cm^{-2}$, as calibrated using a Si photodiode. The surface resistance (<100 Ω/sq) was measured using the four-point probe method with a surface resistivity meter (Guardian Manufacturing, Cocoa, Fla., USA, Model: SRM-232-100, range: 0~100 S2/sq). Incident photon-to-current conversion efficiency (IPCE) or external quantum efficiency (EQE) was measured on a custom-made IPCE system. The scanning electron microscopy images were taken using FEI Nova NanoSEM 650 (FEI Corporation, Hillsboro, Oreg., USA).

Figure 14:
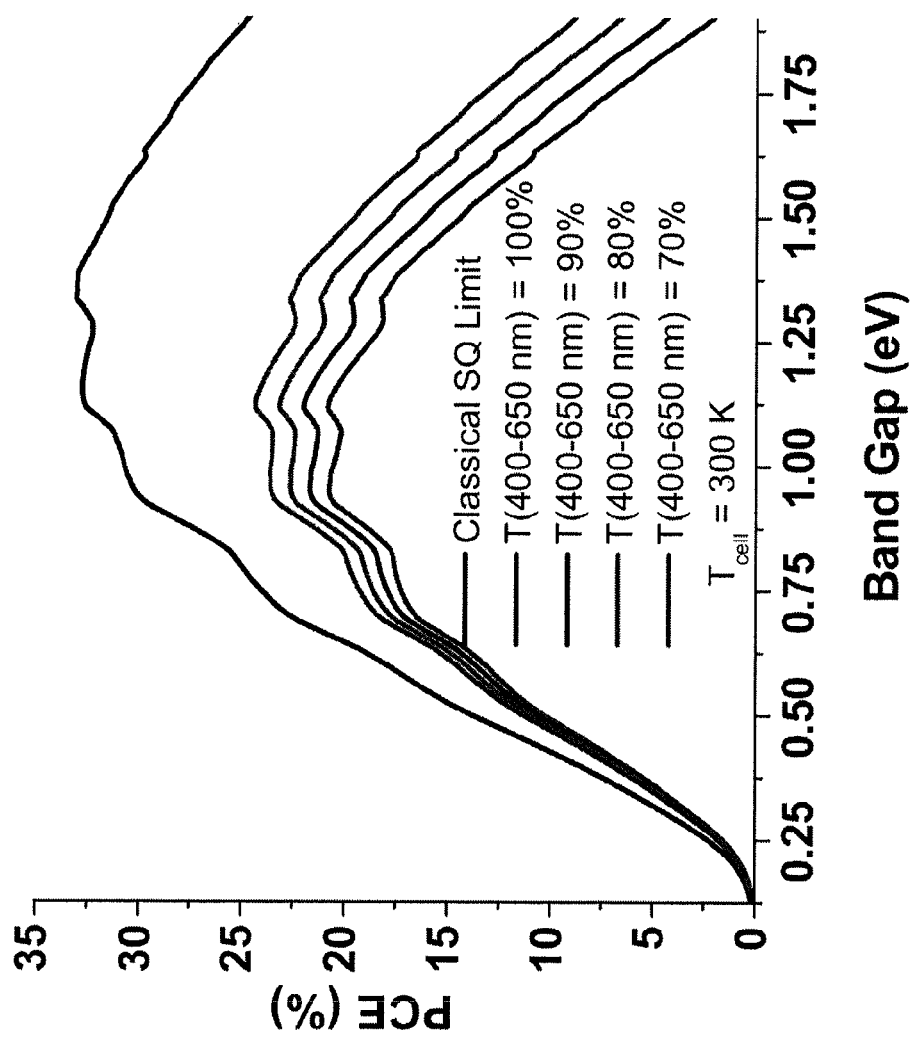
FIG. 14 shows plots of the Shockley-Queisser maximum efficiency as a function of average transmittance in the visible.

Calculation of Ideal Efficiency for Transparent Solar Cells:

We calculate the ideal efficiency of a transparent solar cell by employing Shockley-Queisser theory (S4), but including an anomalous absorption gap from 400-650 nm. Namely, the PCE was calculated by finding the maximum power point for an ideal diode and dividing by 1000 W·$m^{-2}$.

$$PCE = \frac{J_0 k_B T}{10q}(W(z)-1)^2 \exp(W(z)-1) \qquad \text{Eqn. S1}$$

and $$z = e\left(\frac{J_{sc}}{J_0} + 1\right) \qquad \text{Eqn. S2}$$

$$J_0 = \frac{4\pi q}{c^2}\int_{v_R}^{\infty} \frac{v^2}{\exp\left(\frac{hv}{k_B T}\right)-1}dv \qquad \text{Eqn. S3}$$

$$J_{sc} = q\int_{v_g}^{\infty} EQE(v)\phi_{AM1.5G}dv \qquad \text{Eqn. S4}$$

where PCE is the power conversion efficiency of the device in percent, W(z) is the Lambert-W function, q is the magnitude of the electronic charge, e is the base of the natural logarithm, $k_B$ is Boltzmann's constant, h is Plank's constant, c is the speed of light, T is the cell temperature (300 K for all the foregoing calculations), $J_0$ is the Shockley-Queisser dark saturation current (S4), $J_{sc}$ is the short-circuit current density, v is the photon frequency, $v_g$ is the photon frequency corresponding the band gap of the absorber material $E_g = hv_g$, $\phi_{AM1.5G}$ is the AM 1.5 G photon flux, and EQE(v) is the devices external quantum efficiency—taken to be unity for all photon frequencies above the band gap frequency, zero for all below, and <1 for frequencies in the visible. It should be noted that in Eqn. S3 we have multiplied the saturation current density $J_0$ by a factor of 2 to account for the fact that the cell can absorb/radiate ambient black body radiation from both sides of the device (S5). If we include a back mirror, the cell can only radiate out of the top half, and the resulting classical Shockley-Queisser limit in our calculations increases to 33.7%. FIG. 14 shows the results of these calculations for different values of transmittance in the visible. Table 3 summarizes the peak efficiencies and corresponding band gaps for each value of the average transmittance in the visible.

TABLE 3

A summary of the maximum obtainable efficiency and corresponding band gap as related to average transmittance in the visible.

| Avg. $T_{400-650\,nm}$ (%) | Max. PCE (%) | Band Gap (eV) |
|---|---|---|
| Classical SQ Limit | 33.1 | 1.34 |
| 100 | 20.8 | 1.12 |
| 90 | 22 | 1.12 |
| 80 | 23.2 | 1.12 |
| 70 | 24.3 | 1.12 |

REFERENCES AND NOTES

1. G. Yu, J. Gao, J. C. Hummelen, F. Wudl, A. J. Heeger, *Science* 270, 1789 (1995).
2. C. J. Brabec et al., *Adv. Mater.* 22, 3839 (2010).
3. G. Li, R. Zhu, Y. Yang, *Nat. Photonics* 6, 153 (2012).
4. D. J. Lipomi, B. C. K. Tee, M. Vosgueritchian, Z. N. Bao, *Adv. Mater.* 23, 1771 (2011).
5. H. J. Park, T. Xu, J. Y. Lee, A. Ledbetter, L. J. Guo, *ACS Nano* 5, 7055 (2011).
6. A. Henemann, *Renewable Energy Focus* 9, 14 (2008).
7. R. Zhu, A. Kumar, Y. Yang, *Adv. Mater.* 23, 4193 (2011).
8. R. F. Bailey-Salzman, B. P. Rand, S. R. Forrest, *Appl. Phys. Lett.* 88, 233502 (2006).
9. G. M. Ng et al., *Appl. Phys. Lett.* 90, 103505 (2007).
10. J. S. Huang, G. Li, Y. Yang, *Adv. Mater.* 20, 415 (2008).
11. Y. Y. Lee et al., *ACS Nano* 5, 6564 (2011).
12. T. Ameri et al., *Adv. Funct. Mater.* 20, 1592 (2010).
13. W. Gaynor, J. Y. Lee, P. Peumans, *ACS Nano* 4, 30 (2010).
14. A. Colsmann et al., *Adv. Energy Mater.* 1, 599 (2011).
15. R. R. Lunt, V. Bulovic, *Appl. Phys. Lett.* 98, 113305 (2011).
16. J. Meiss, F. Holzmueller, R. Gresser, K. Leo, M. Riede, *Appl. Phys. Lett.* 99, 193307 (2011).
17. A. Bauer, T. Wahl, J. Hanisch, E. Ahlswede, *Appl. Phys. Lett.* 100, 073307 (2012).
18. D. S. Hecht, L. B. Hu, G. Irvin, *Adv. Mater.* 23, 1482 (2011).
19. A. D. Pasquier, H. E. Unalan, A. Kanwal, S. Miller, M. Chhowalla, *Appl. Phys. Lett.* 87, 203511 (2005).
20. M. W. Rowell et al., *Appl. Phys. Lett.* 88, 233506 (2006).
21. H. A. Becerril et al., *ACS Nano* 2, 463 (2008).
22. V. C. Tung et al., *Nano. Lett.* 9, 1949 (2009).
23. J. Y. Lee, S. T. Connor, Y. Cui, P. Peumans, *Nano. Lett.* 8, 689 (2008).
24. L. B. Hu, H. S. Kim, J. Y. Lee, P. Peumans, Y. Cui, *ACS Nano* 4, 2955 (2010).
25. Z. B. Yu et al., *Adv. Mater.* 23, 664 (2011).
26. R. Zhu et al., *ACS Nano* 5, 9877 (2011).
27. L. T. Dou et al., *Nat. Photonics* 6, 180 (2012).
28. S. De et al., *ACS Nano* 3, 1767 (2009).
29. Z. Xu et al., *Adv. Funct. Mater.* 19, 1227 (2009).
30. J. Y. Kim et al., *Adv. Mater.* 18, 572 (2006).
31. M. H. Park, J. H. Li, A. Kumar, G. Li, Y. Yang, *Adv. Funct. Mater.* 19, 1241 (2009).
S1. L. T. Dou et al., *Nat. Photonics* 6, 180 (2012).
S2. M. H. Park, J. H. Li, A. Kumar, G. Li, Y. Yang, *Adv. Funct. Mater.* 19, 1241 (2009).
S3. R. Zhu et al., *ACS Nano* 5, 9877 (2011).
S4. W. Shockley, H. J. Queisser, *J. Appl. Phys.* 32, 510 (1961).
S5. T. Kirchartz, U. Rau, Physica Status Solidi a-Applications and Materials Science 205, 2737 (2008).

The embodiments illustrated and discussed in this specification are intended only to teach those skilled in the art how to make and use the invention. In describing embodiments of the invention, specific terminology is employed for the sake of clarity. However, the invention is not intended to be limited to the specific terminology so selected. The above-described embodiments of the invention may be modified or varied, without departing from the invention, as appreciated by those skilled in the art in light of the above teachings. It is therefore to be understood that, within the scope of the claims and their equivalents, the invention may be practiced otherwise than as specifically described.

We claim:

1. An electro-optic device, comprising:
a first electrode;
an active layer formed over and electrically connected with said first electrode;
a buffer layer formed over and electrically connected with said active layer; and
a second electrode formed directly on said buffer layer, wherein said second electrode comprises a plurality of nanowires interconnected into a network of nanowires,
wherein said buffer layer provides a physical barrier between said active layer and said plurality of nanowires to prevent damage to said active layer while said second electrode is formed.

2. An electro-optic device according to claim 1, wherein said buffer layer at least 1 nm thick.

3. An electro-optic device according to claim 1, wherein said buffer layer at least 1 nm thick and less than 1000 nm thick.

4. An electro-optic device according to claim 3, wherein said buffer layer at least 30 nm thick and less than 51 nm thick.

5. An electro-optic device according to claim 1, wherein said plurality of nanowires interconnected into said network of nanowires have electrically connected junctions at overlapping nanowire portions and define spaces void of said nanowires, and
wherein said second electrode further comprises a plurality of nanoparticles disposed to at least partially fill a plurality of said spaces to provide additional electrically conducting pathways for said network of nanowires across said spaces, and
wherein said plurality of nanoparticles are at least one of electrically conducting or semiconducting nanoparticles.

6. An electro-optic device according to claim 5, wherein said plurality of nanoparticles are substantially optically transparent nanoparticles, and
wherein said network of nanowires and said plurality of nanoparticles form at least a portion of an optically transparent electrode of said electro-optic device.

7. An electro-optic device according to claim 5, wherein at least some of said plurality of nanoparticles fuse junctions of overlapping nanowires together to reduce electrical sheet resistance of said network of nanowires.

8. An electro-optic device according to claim 6, wherein said buffer layer comprises electrically conducting and optically transparent nanoparticles.

9. An electro-optic device according to claim 5, further comprising a polymer layer at least one of encapsulating said layer of nanowires and said plurality of nanoparticles or being intermixed with at least one of said layer of nanowires and said plurality of nanoparticles to form a composite polymer-nanowire-nanoparticle layer.

10. An electro-optic device according to claim 5, wherein said plurality of nanoparticles comprise at least one of a metal oxide, a conducting polymer, graphene, or fluorine-doped tin oxide.

11. An electro-optic device according to claim 10, wherein said plurality of nanoparticles comprise at least one metal oxide selected from the group of metal oxides consisting of indium tin oxide, tin oxide, zinc oxide, aluminum zinc oxide, indium zinc oxide, vanadium oxide, and cerium oxide.

12. An electro-optic device according to claim 1, wherein said plurality of nanowires comprise at least one of carbon nanotubes or metal nanowires.

13. An electro-optic device according to claim 12, wherein said metal nanowires comprise at least one of silver, gold, copper, or aluminum.

14. An electro-optic device according to claim 1, wherein said second electrode comprises a plurality of nanowires interconnected into a network of nanowires.

15. An electro-optic device according to claim 1, wherein said second electrode is an optically transparent electrode.

16. An electro-optic device according to claim 1, wherein said active layer is a bulk heterojunction organic semiconductor.

17. An electro-optic device according to claim 16, wherein said electro-optic device is a photovoltaic device that has an average transparency of at least 10% across the visible range of wavelengths 400 nm to 650 nm.

18. An electro-optic device according to claim 16, wherein said electro-optic device is a photovoltaic device that has an average transparency of at least 30% across the visible range of wavelengths 400 nm to 650 nm.

19. An electro-optic device according to claim 16, wherein said electro-optic device is a photovoltaic device that has an average transparency of at least 50% across the visible range of wavelengths 400 nm to 650 nm.

20. An electro-optic device according to claim 16, wherein said electro-optic device is a photovoltaic device that has an average transparency of at least 70% across the visible range of wavelengths 400 nm to 650 nm.

21. An electro-optic device according to claim 16, wherein said bulk heterojunction organic semiconductor comprises a polymer comprising a repeated unit having the structure of formula (I)

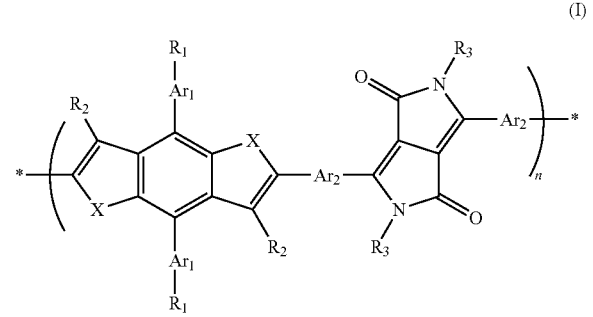

(I)

wherein $R_1$, $R_2$ and $R_3$ are independently selected from alkyl groups with up to 18 C atoms, aryls and substituted aryls;

X is selected from Oxygen, Sulfur, Selenium and Nitrogen atoms; and $Ar_1$ and $Ar_2$ are each, independently, one to five monocyclic arylene, bicyclic arylene, and polycyclic arylene, monocyclic heteroarylene, bicyclic heteroarylene and polycyclic heteroarylene groups, either fused or linked.

22. An electro-optic device according to claim 21, wherein $Ar_1$ and $Ar_2$ are independently selected from the group consisting of

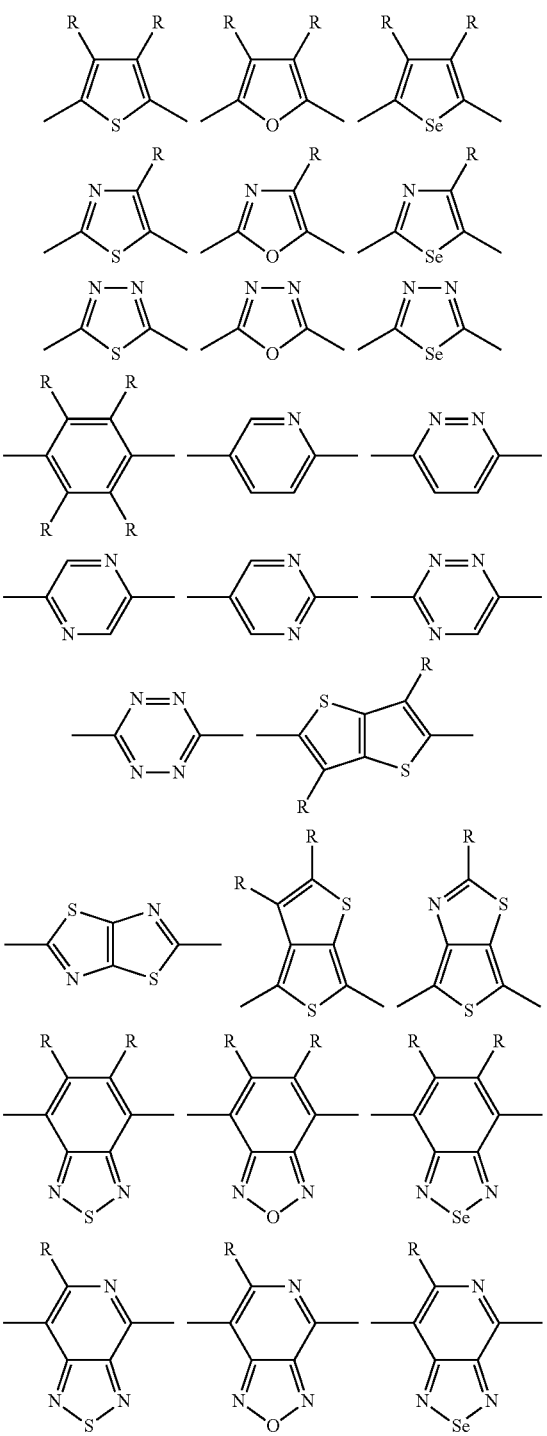

-continued

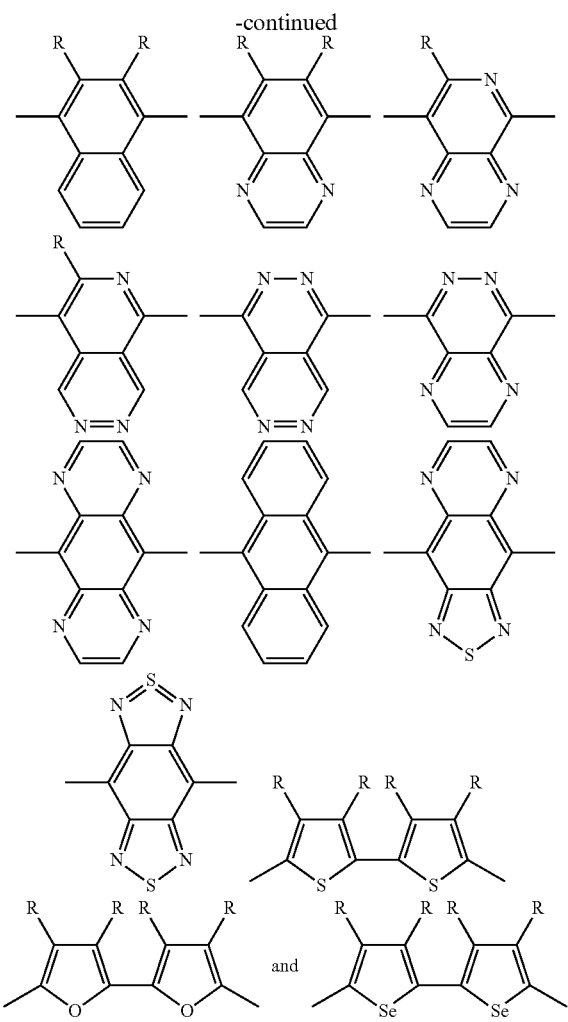

where, in the above structures, R is a proton, fluorine atom, CF$_3$, CN, NO$_2$, or alkyl group with carbon atom number of 1-18.

23. An electro-optic device according to claim 21, wherein the repeated unit has the structure of formula (II)

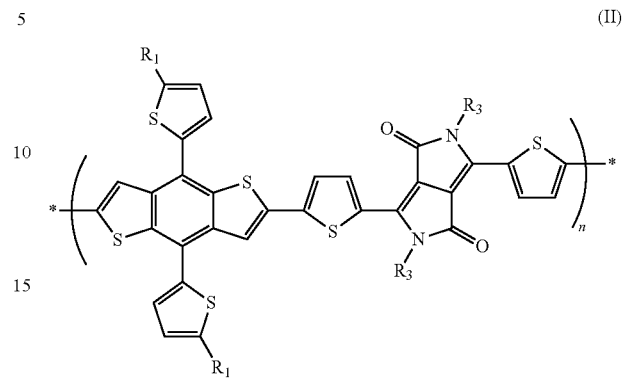

where R$_1$ and R$_3$ are independently selected from alkyl groups with up to 18 C atoms, aryls and substituted aryls.

24. An electro-optic device according to claim 23, wherein the R$_1$ and R$_3$ are independently selected from alkyl groups with 4 to 12 C atoms.

25. An electro-optic device according to claim 24, wherein R$_1$ is a 2-ethylhexyl group and R$_3$ is a 2-butyloctyl group.

26. An electro-optic device according to claim 1, wherein said buffer layer is a p-type semiconductor and said electro-optic device is a photovoltaic device with an inverted device structure.

27. An electro-optic device according to claim 1, wherein said buffer layer is an n-type semiconductor and said electro-optic device is a photovoltaic device with a regular device structure.

28. An electro-optic device according to claim 1, further comprising:
 a second active layer electrically connected with the first-mentioned active layer along a first side; and
 a third electrode electrically connected to said second active layer along a second side of said second active layer such that said electro-optic device is a tandem electro-optic device.

* * * * *

UNITED STATES PATENT AND TRADEMARK OFFICE
CERTIFICATE OF CORRECTION

| | | |
|---|---|---|
| PATENT NO. | : 8,993,998 B2 | Page 1 of 1 |
| APPLICATION NO. | : 13/841367 | |
| DATED | : March 31, 2015 | |
| INVENTOR(S) | : Yang Yang et al. | |

It is certified that error appears in the above-identified patent and that said Letters Patent is hereby corrected as shown below:

On the title page item (72), lines 2 and 4, should be corrected to read as follows:

Rui Zhu, Concord, CA; and

Letian Dou, El Cerrito, CA

Signed and Sealed this
First Day of March, 2016

Michelle K. Lee
*Director of the United States Patent and Trademark Office*